(12) United States Patent
Noda et al.

(10) Patent No.: US 8,124,975 B2
(45) Date of Patent: Feb. 28, 2012

(54) DISPLAY DEVICE WITH MULTI-GATE TFTS OF A PIXEL REGION HAVING DIFFERENT RELATIVE AREAS OF GATE REGIONS WITH RESPECT TO CHANNEL REGIONS OF THE TFTS

(75) Inventors: Takeshi Noda, Mobara (JP); Toshio Miyazawa, Chiba (JP); Takuo Kaitoh, Mobara (JP); Hiroyuki Abe, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 156 days.

(21) Appl. No.: 12/608,147

(22) Filed: Oct. 29, 2009

(65) Prior Publication Data
US 2010/0109009 A1    May 6, 2010

(30) Foreign Application Priority Data

Oct. 30, 2008  (JP) .............................. 2008-280598
Oct. 30, 2008  (JP) .............................. 2008-280602

(51) Int. Cl.
*H01L 33/00*    (2010.01)

(52) U.S. Cl. ........ 257/59; 257/72; 257/88; 257/E33.053; 257/69; 257/347; 257/348; 257/350; 257/351; 257/354; 257/355; 257/195; 257/E29.147; 257/E29.202

(58) Field of Classification Search .................... 257/59, 257/72, 88, E33.053, 69, 347, 348, 349, 350, 257/351, 352, 354, 355, 195
See application file for complete search history.

(56) References Cited

U.S. PATENT DOCUMENTS

| | | | |
|---|---|---|---|
| 6,166,397 A * | 12/2000 | Yamazaki et al. | 257/59 |
| 6,744,288 B1 * | 6/2004 | Doyle et al. | 327/108 |
| 6,812,912 B2 * | 11/2004 | Miyajima et al. | 345/92 |
| 2002/0068372 A1 * | 6/2002 | Kunii | 438/30 |

FOREIGN PATENT DOCUMENTS

JP    2002-057339    2/2002

* cited by examiner

*Primary Examiner* — Marc Armand
(74) *Attorney, Agent, or Firm* — Antonelli, Terry, Stout & Kraus, LLP.

(57) ABSTRACT

Provided is a display device capable of suppressing generation of optical leakage current as well as increase in capacitance in a case where a plurality of thin film transistors (TFTs) including a gate electrode film on a light source side are formed in series. Relative areas of opposing regions between a semiconductor film and the gate electrode film with respect to channel regions are different in at least a part of the plurality of TFTs, to thereby provide a flat panel display having a structure for suppressing increase in capacitance while suppressing generation of optical leakage current.

9 Claims, 25 Drawing Sheets

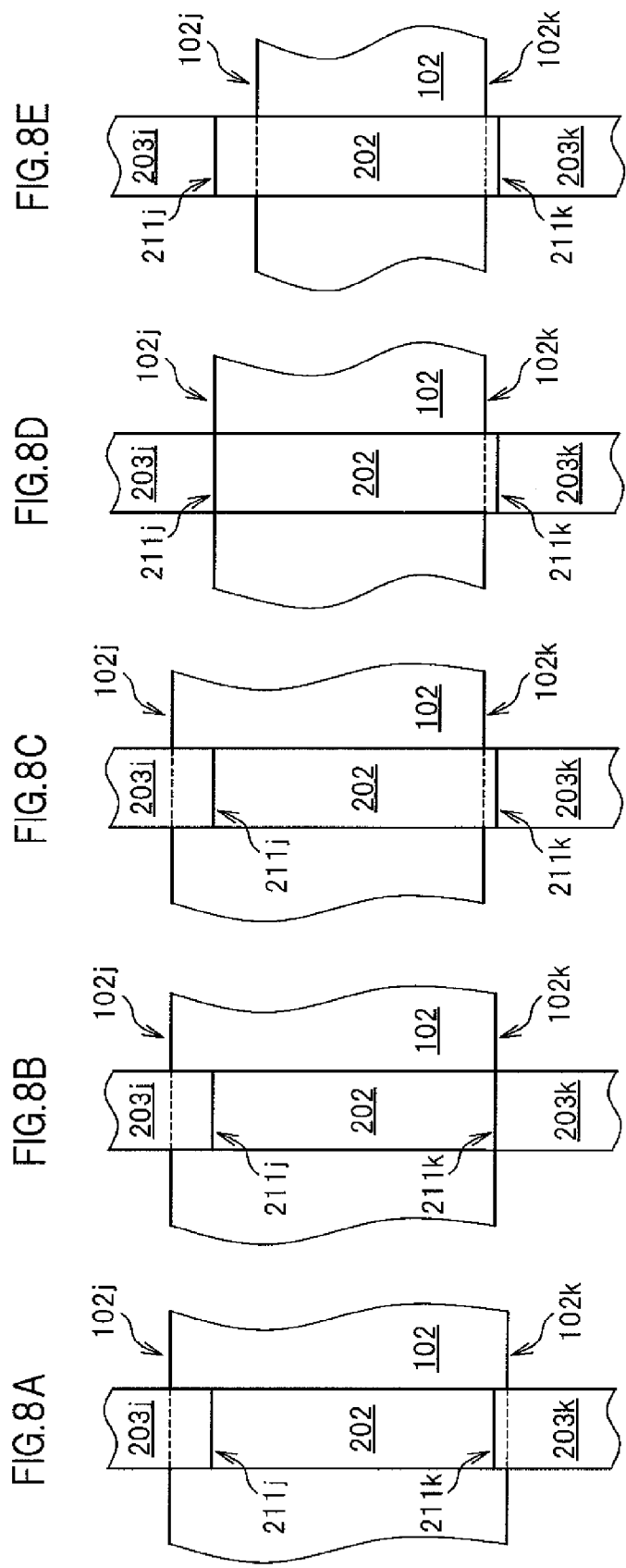

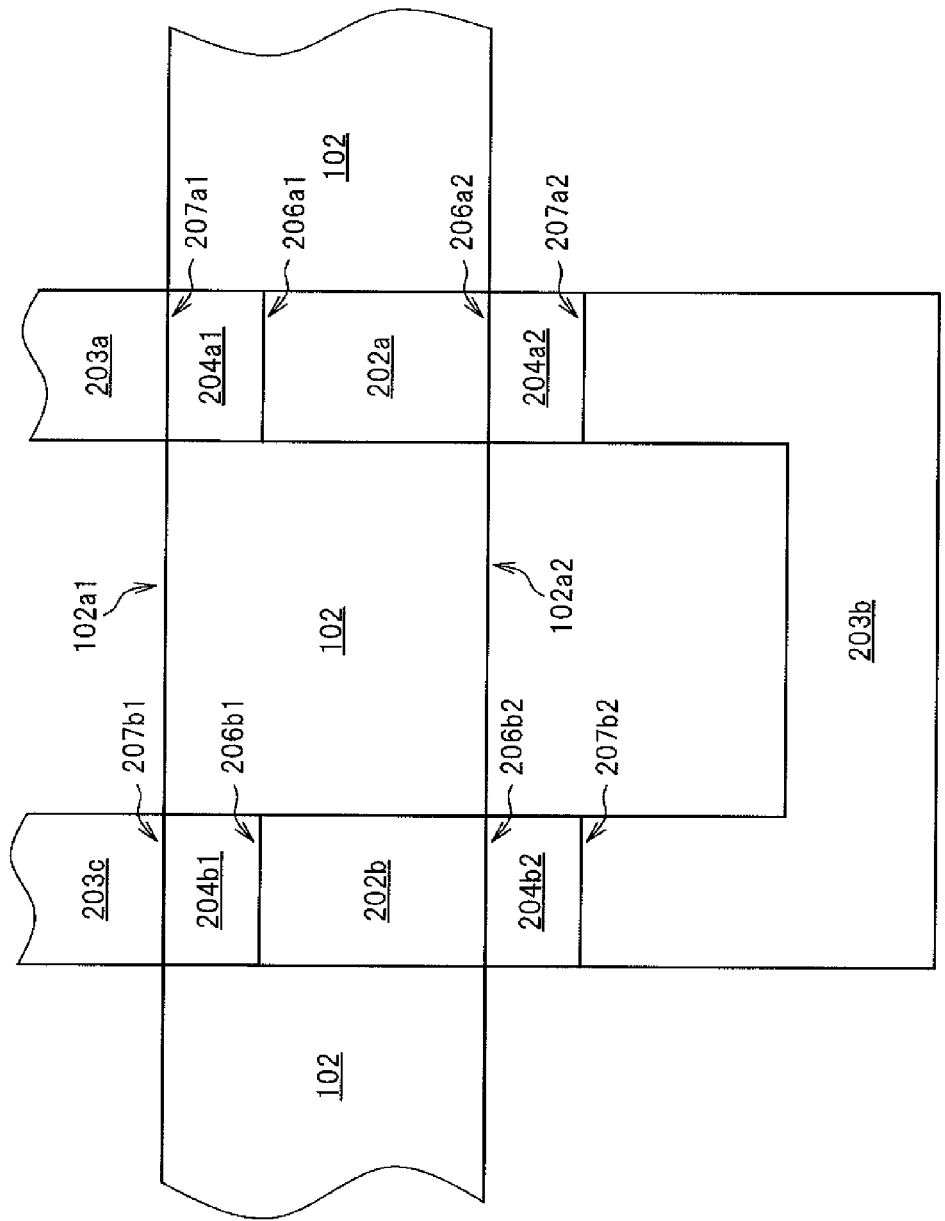

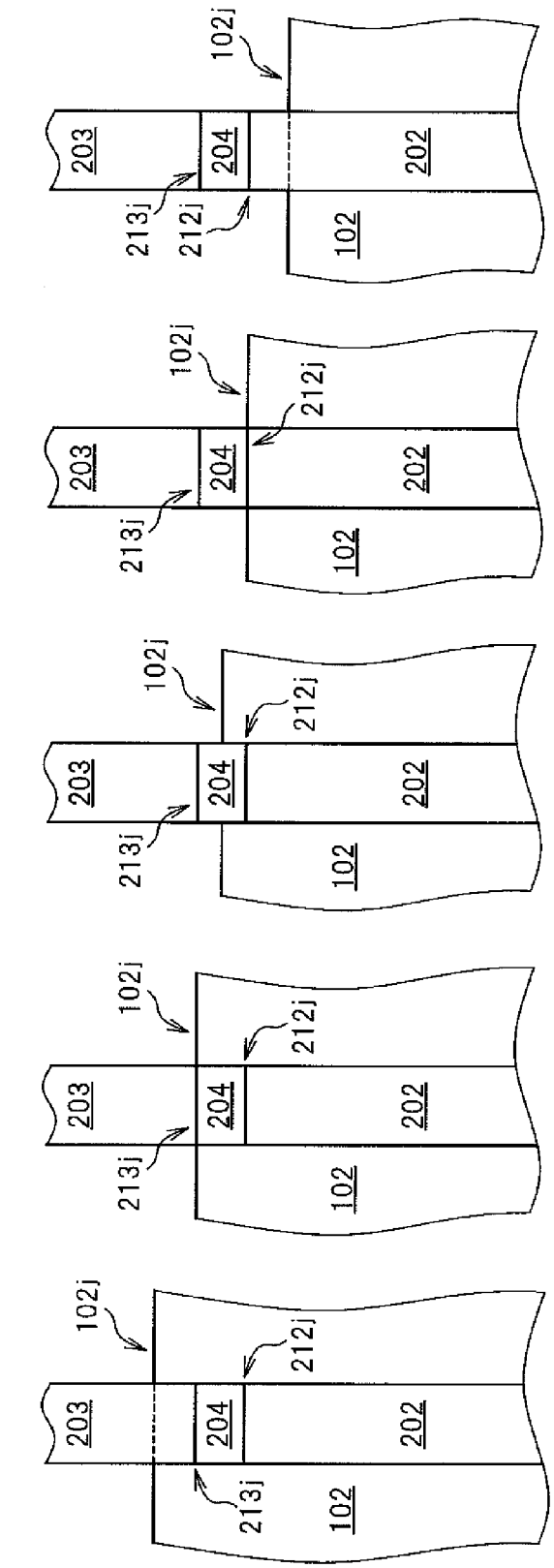

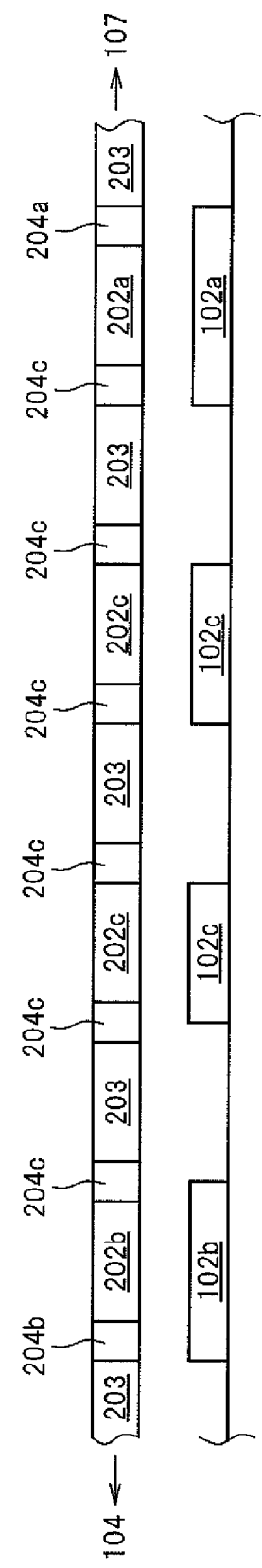

DISPLAY DEVICE WITH MULTI-GATE TFTS OF A PIXEL REGION HAVING DIFFERENT RELATIVE AREAS OF GATE REGIONS WITH RESPECT TO CHANNEL REGIONS OF THE TFTS

CROSS-REFERENCE TO RELATED APPLICATIONS

The present application claims priority from Japanese patent applications JP 2008-280598 filed on Oct. 30, 2008, and JP 2008-280602 filed on Oct. 30, 2008, the contents of which are hereby incorporated by reference into this application.

BACKGROUND OF THE INVENTION

1. Field of the Invention

The present invention relates to a display device, and more particularly, to an improvement in display quality in a display device which uses thin film transistors (hereinafter referred to as TFTs) to perform display control of pixels.

2. Description of the Related Art

A display device such as a liquid crystal display device uses TFTs and the like to perform display control of pixels. As the TFTs, there are known bottom gate TFTs having a structure in which a gate electrode film is positioned on a light source side with respect to a semiconductor film. When the TFT having this structure is irradiated with light from a light source, such as a backlight, a gate electrode itself serves as a light shield mask with respect to the semiconductor film opposed to the gate electrode.

When the semiconductor film is irradiated with light, hole-electron pairs are generated. In particular, in a case of a TFT using polycrystalline silicon, frequency of the generation becomes significantly lower as carrier concentration is higher. Accordingly, in a channel region and a depletion layer region formed at a PN junction portion in a vicinity of the channel region, hole-electron pairs are more likely to be generated compared to other regions. As a result, if those regions are not sufficiently shielded against light by a gate electrode opposed thereto, hole-electron pairs are generated to generate optical leakage current, resulting in increased off-state current.

Of the TFTs, the TFT using polycrystalline silicon has a problem of a relatively large off-state current. To reduce the off-state current, for example, a multi-gate structure in which a plurality of TFTs are connected in series is employed (see, for example, JP 2002-57339 A).

In the multi-gate structure using TFTs including a gate electrode film formed on a light source side, a semiconductor film thereof includes a plurality of channel regions formed in series, with regions in which predetermined impurities are doped being interposed between the channel regions.

On this occasion, when each channel region and the vicinity thereof are irradiated with light in a state of being not sufficiently shielded against light by a gate electrode, hole-electron pairs are generated to generate optical leakage current. Accordingly, if all of the TFTs have such a structure as described above, the optical leakage current is not suppressed.

Further, it is known that optical leakage current is likely to be generated when hole-electron pairs are generated in a vicinity of an end of the above-mentioned plurality of channel regions which is positioned closest to an image signal line side or a pixel electrode side among respective both ends thereof.

The reason therefor is as follows. In the vicinity of the channel region end which is positioned closest to one of the image signal line side and the pixel electrode side, on which a higher potential is maintained, a stronger electric field is often generated than in other channel region ends. The hole-electron pairs that are generated in the vicinity of the channel region end are often separated into holes and electrons by the strong electric field, resulting in increased leakage current.

On the other hand, when each channel region and the vicinity thereof are sufficiently shielded against light by the gate electrode, optical leakage current is suppressed, but an area of the region in which the semiconductor film and the gate electrode film are opposed to each other is increased, resulting in increased parasitic capacitance. If all of the TFTs have such a structure as described above, parasitic capacitance is increased more in accordance with the number of TFTs.

When a gate voltage is turned off to maintain a pixel voltage, increased parasitic capacitance causes the pixel voltage to be largely decreased, which results in a new cause of display failure.

SUMMARY OF THE INVENTION

It is an object of the present invention to provide a display device capable of suppressing generation of optical leakage current as well as increase in capacitance in a case where a plurality of thin film transistors (TFTs) including a gate electrode film on a light source side are formed in series.

(1) A display device according to the present invention includes: a semiconductor film including a plurality of channel regions formed in series between an image signal line and a pixel electrode with impurity doped regions in which predetermined impurities are doped being interposed between any two adjacent channel regions among the plurality of channel regions, the plurality of channel regions including at least a first channel region and a second channel region; a light source which generates light, the light source being disposed on one side of the semiconductor film; and a gate electrode film formed between the semiconductor film and the light source, the gate electrode film including: a first gate region spreading over a region opposed to the first channel region of the semiconductor film on a side of the light source; and a second gate region spreading over a region opposed to the second channel region of the semiconductor film on the side of the light source, in which a relative area of the first gate region with respect to the first channel region is different from a relative area of the second gate region with respect to the second channel region.

(2) Further, in the above-mentioned display device, the impurity doped regions may include a low concentration region formed in at least one region adjacent to one of the first channel region and the second channel region, the low concentration region being doped with one of the predetermined impurities and impurities different from the predetermined impurities at concentration lower than impurity concentration of a region formed outside the low concentration region.

(3) Further, in the above-mentioned display device, an area of the first gate region may be larger than an area of the first channel region.

(4) Further, in the above-mentioned display device, one of an area of the second channel region and an area determined by adding together the area of the second channel region and an area of the low concentration region formed adjacent to the second channel region in a case where the low concentration region is formed adjacent to the second channel region may be larger than an area of the second gate region.

(5) Further, in the above-mentioned display device, the impurity doped regions may further include the low concentration regions formed in regions adjacent to both ends of the first channel region and both ends of the second channel region.

(6) Further, in the above-mentioned display device, the first channel region may be positioned closest to the pixel electrode among the plurality of channel regions.

(7) Further, in the above-mentioned display device, one of an area of each of the plurality of channel regions excluding the first channel region and an area determined by adding together the area of the each of the plurality of channel regions and an area of the low concentration region formed adjacent to the each of the plurality of channel regions in a case where the low concentration region is formed adjacent to the each of the plurality of channel regions may be larger than an area of a region of the gate electrode film, the region of the gate electrode film being opposed to the each of the plurality of channel regions.

(8) Further, the gate electrode film may have a strip shape with a varying strip width so that the relative area of the first gate region with respect to the first channel region is different from the relative area of the second gate region with respect to the second channel region.

(9) A display device according to the present invention includes: a semiconductor film including a plurality of channel regions formed in series between an image signal line and a pixel electrode with impurity regions in which predetermined impurities are doped being interposed between any two adjacent channel regions among the plurality of channel regions, the semiconductor film being partially formed into a strip shape; a light source which generates light, the light source being disposed on one side of the semiconductor film; and a gate electrode film formed between the semiconductor film and the light source, the gate electrode film including a plurality of gate regions spreading over regions opposed to the plurality of channel regions of the semiconductor film on a side of the light source, in which the plurality of channel regions have channel ends including a first channel end and a second channel end which are respectively positioned closest to the pixel electrode and the image signal line, and the plurality of gate regions have gate ends including a first gate end and a second gate end which are respectively positioned closest to the pixel electrode and the image signal line, the first gate end and the second gate end being respectively positioned on a side of the pixel electrode and a side of the image signal line with respect to the first channel end and the second channel end; and the gate ends of the plurality of gate regions further include a gate end nearest to at least one channel end of the channel ends of the plurality of channel regions other than the first channel end and the second channel end, the nearest gate end being positioned at a smaller distance from the at least one channel end than a distance between the first channel end and a gate end nearest to the first channel end, and a distance between the second channel end and a gate end nearest to the second channel end.

(10) Further, in the display device according to item (9), the impurity regions may include low concentration regions formed in regions adjacent to the first channel end and the second channel end, each of the low concentration regions being doped with one of the predetermined impurities and impurities different from the predetermined impurities at lower concentration than impurity concentration of regions formed outside the low concentration regions.

(11) Further, in the display device according to item (9), the impurity regions may include low concentration regions formed in all regions adjacent to the plurality of channel regions, each of the low concentration regions being doped with one of the predetermined impurities and impurities different from the predetermined impurities at lower concentration than impurity concentration of regions formed outside the low concentration regions.

(12) Further, in the display device according to any one of items (9) to (11), the gate end nearest to the at least one channel end other than the first channel end and the second channel end may be positioned inside with respect to an end of a low concentration region on a side of one of the impurity regions in a case where the low concentration region is formed in contact with the at least one channel end.

(13) Further, in the display device according to any one of items (9) to (11), the gate end nearest to each of all of the channel ends other than the first channel end and the second channel end may be positioned inside with respect to an end of a low concentration region on a side of one of the impurity regions in a case where the low concentration regions are formed in contact with the all of the channel ends.

(14) Further, in the display device according to item (9), the gate electrode film may have a strip shape with a varying strip width.

According to the present invention, there is provided the display device having a structure for suppressing increase in capacitance while suppressing generation of optical leakage current because relative areas of opposing regions between the semiconductor film and the gate electrode film with respect to the channel regions are different in at least a part of the plurality of TFTs.

In other words, it becomes possible to suppress optical leakage current when at least a part of the plurality of TFTs is shielded against light. Therefore, even when hole-electron pairs causing optical leakage current are generated in other parts having a smaller degree of light shielding than the shielded part thereof, because the TFTs are formed in series, it is possible to prevent the generated hole-electron pairs from becoming optical leakage current flowing between the pixel electrode and the image signal line. Besides, the increase in capacitance can be suppressed in the other parts, which makes it possible to prevent display failure due to decrease in pixel voltage caused by capacitance of the TFTs.

Further, according to the present invention, there is provided the display device having a structure in which the vicinities of channel ends positioned on outermost sides among the channel ends of the plurality of channel regions, which are often applied with a stronger electric field than that in other regions, have a larger degree of light shielding to thereby suppress optical leakage current while increase in capacitance is suppressed in the vicinities of the other channel ends.

In other words, in the above-mentioned vicinities of the channel ends positioned on the outermost sides in which optical leakage current is considered to be more likely to be generated, generation of hole-electron pairs is suppressed to suppress optical leakage current. As a result, even when hole-electron pairs are generated in the other regions having a smaller degree of light shielding than the above-mentioned vicinities of the channel ends, because the TFTs are formed in series, it is possible to prevent the generated hole-electron pairs from becoming optical leakage current flowing between the image signal line and the pixel electrode. Besides, the increase in capacitance can be suppressed in the other regions, which makes it possible to prevent display failure due to decrease in pixel voltage caused by capacitance of the TFTs.

BRIEF DESCRIPTION OF THE DRAWINGS

In the accompanying drawings:

FIGS. 8A to 8E are enlarged plan views each illustrating the semiconductor film including the first impurity regions formed in contact with the both ends of the channel region, and the gate electrode film positioned below the semiconductor film when viewed from above, in which the distance between the channel region end and the gate electrode film end is different between the both ends of the channel region;

FIG. 14 is an enlarged plan view of a vicinity of TFTs of FIG. 12;

FIGS. 16A to 16E are enlarged plan views each illustrating the semiconductor film in which a second impurity region is formed in contact with the channel end of the channel region, and the first impurity region is formed outside and in contact with the second impurity region, and the gate electrode film positioned below the semiconductor film when viewed from above;

FIGS. 17D and 17E are schematic views each illustrating a structure of four TFTs having a multi-gate structure;

DETAILED DESCRIPTION OF THE INVENTION

Referring to the accompanying drawings, embodiments of the present invention are described below.

Embodiment 1

Figure 1:
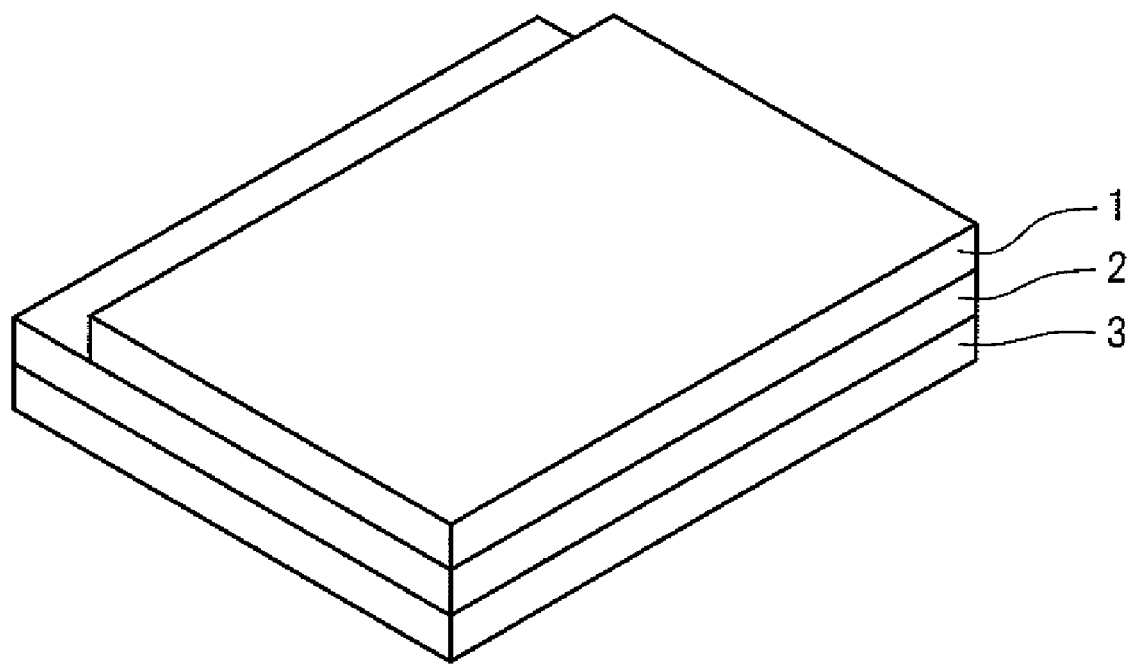
FIG. 1 is a schematic view illustrating substrates and the like constituting a liquid crystal display device.

A display device according to an embodiment of the present invention is a liquid crystal display device employing one of in-plane switching (IPS) modes. As illustrated in a schematic view of FIG. 1, the liquid crystal display device includes a thin film transistor (TFT) substrate 2, a filter substrate 1, a liquid crystal material, and a backlight 3. In the TFT substrate 2, there are arranged scanning signal lines, image signal lines, TFTs having a multi-gate structure, pixel electrodes, common electrodes, and the like. The filter substrate 1 is provided with a color filter and opposed to the TFT substrate 2. The liquid crystal material is sealed within a region sandwiched between the filter substrate 1 and the TFT substrate 2. The backlight 3 is provided on a TFT substrate side. In the TFT substrate 2, the TFTs are arranged on a transparent substrate, such as a glass substrate.

Figure 2:
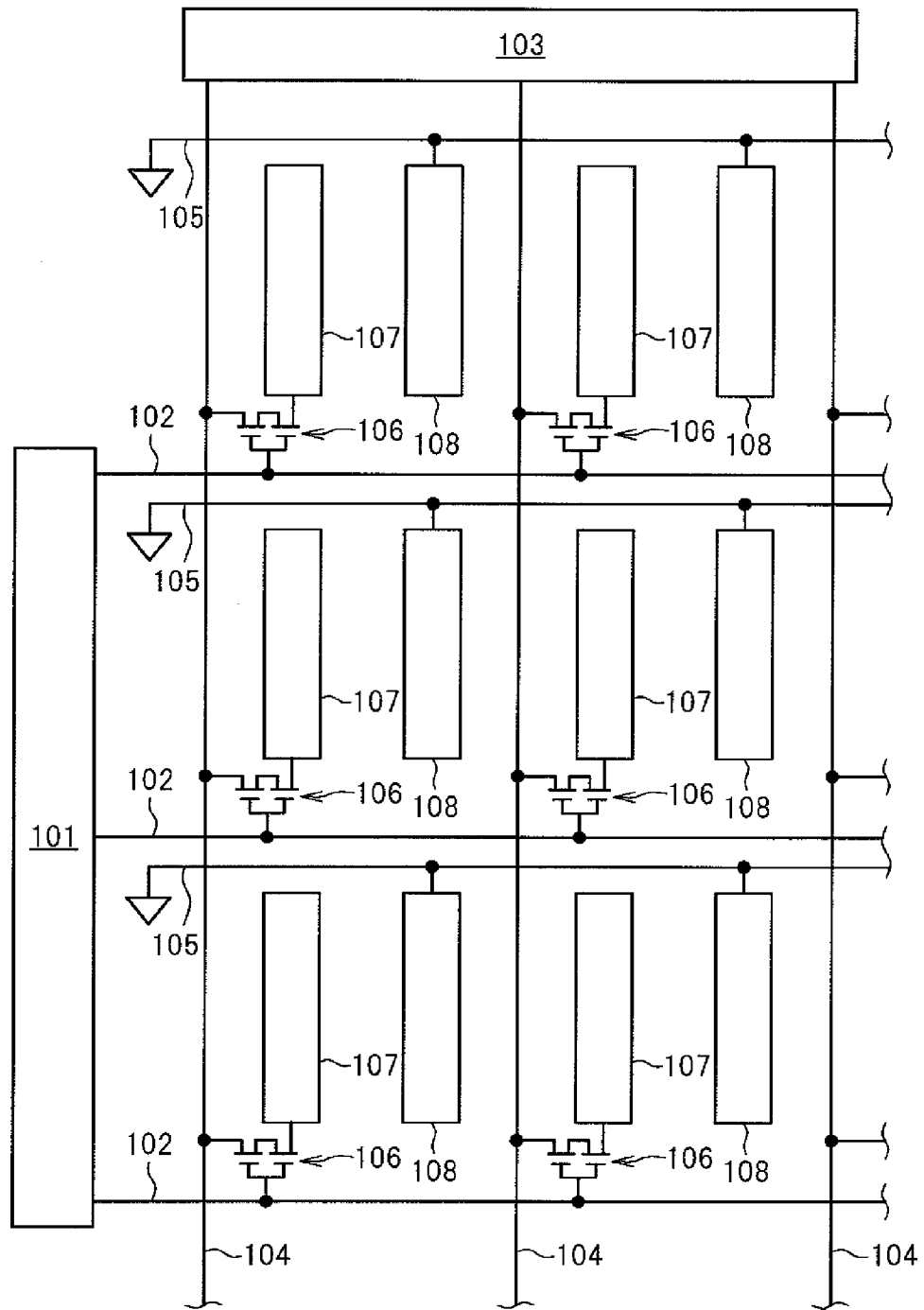
FIG. 2 is an equivalent circuit diagram of a thin film transistor (TFT) substrate constituting the in-plane switching (IPS) mode liquid crystal display device.

FIG. 2 is a diagram illustrating an equivalent circuit of the TFT substrate 2 of the above-mentioned liquid crystal display device.

Referring to FIG. 2, in the TFT substrate 2, a large number of gate signal lines 102 are connected to a gate driver 101 and serve as scanning signal lines. The gate signal lines 102 extend in the lateral direction of FIG. 2 at equal intervals thereamong. Further, a large number of image signal lines 104 are connected to a data driver 103, and extend in the longitudinal direction of FIG. 2 at equal intervals thereamong. Those gate signal lines 102 and image signal lines 104 define pixel regions arranged in a lattice pattern. Moreover, common signal lines 105 extend in the lateral direction of FIG. 2 in parallel with the gate signal lines 102.

At a corner of each of the pixel regions defined by the gate signal lines 102 and the image signal lines 104, a plurality of TFTs 106 connected in series to have a multi-gate structure are formed. The plurality of the TFTs 106 are connected to the image signal line 104 and a pixel electrode 107. Each gate electrode of the TFTs 106 is connected to the gate signal line 102. In each pixel circuit, a pair of the pixel electrode 107 and a common electrode 108 opposed to each other are formed. Note that FIG. 2 illustrates an example of the multi-gate structure constituted by two TFTs.

In the circuit configuration described above, a reference voltage is applied to the common electrode 108 included in each pixel circuit via the common signal line 105 while a gate voltage is selectively applied to the gate signal line 102, to thereby control a current flowing through the TFTs 106. In accordance with the gate voltage selectively applied to the gate signal line 102, a voltage of an image signal supplied to the image signal line 104 is selectively applied to the pixel electrode 107. In this way, alignment of liquid crystal molecules and the like are controlled.

Figure 3:
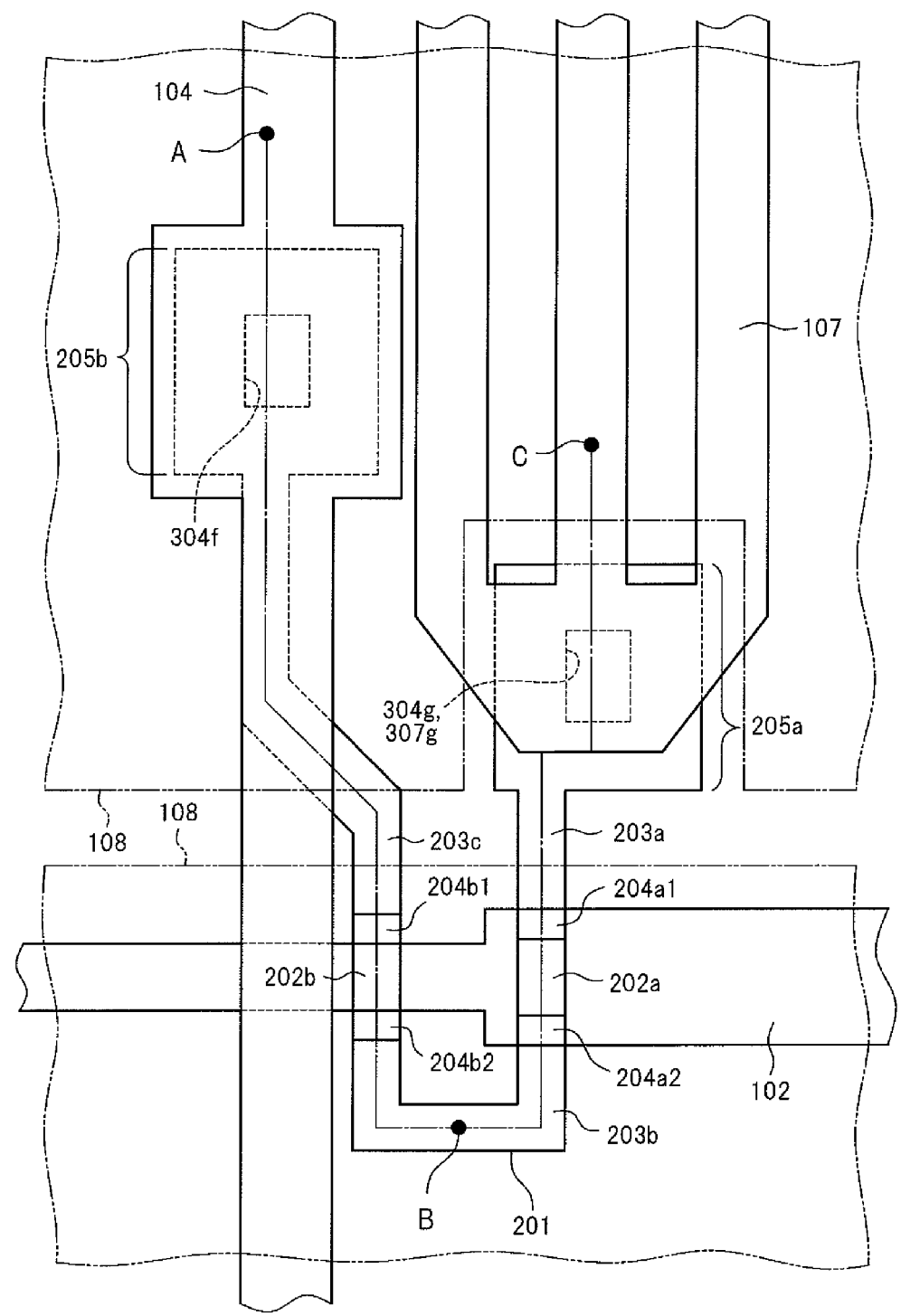
FIG. 3 is an enlarged plan view of one pixel region of the TFT substrate according to Embodiment 1 of the present invention.

FIG. 3 is an enlarged plan view of one pixel region of the TFT substrate 2. In FIG. 3, a semiconductor film 201 is illustrated. A pad portion 205b is formed at an end of the semiconductor film 201 on the A side of FIG. 3. An interlayer insulation film 304 is formed over the pad portion 205b, and has a contact hole 304f formed therein. The pad portion 205b is connected to the image signal line 104 through a high conductive material such as aluminium. On the other hand, a pad portion 205a is formed at an end of the semiconductor film 201 on the C side of FIG. 3, and an interlayer insulation film 304 formed over the pad portion 205a also has a contact hole 304g formed therein. Further, a plurality of insulation films 305, 306, and 307 formed above the contact hole 304g also have a contact hole 307g formed therein. The pad portion 205a is connected via an electrode 308 formed thereabove to the pixel electrode 107. The pixel electrode 107 is formed above the common electrode 108 which is positioned above the electrode 308, without being electrically connected to the common electrode 108. On a lower side of the semiconductor film 201, a gate electrode film 102 is positioned via a gate insulation film 303 to thereby form the gate signal line 102 (see FIG. 4).

The semiconductor film 201 has a strip shape with a uniform strip width between the pad portions 205b and 205a formed at the both ends thereof. From the pad portion 205b formed at the end of the semiconductor film 201 on the A side of FIG. 3, the strip-shaped semiconductor film 201 extends below and in parallel with the image signal line 104, and then is formed along an oblique line to deviate away from below the image signal line 104. The semiconductor film 201 extends again in parallel with the image signal line 104. The semiconductor film 201 orthogonally intersects, via the gate insulation film 303, with the strip-shaped gate electrode film 102 which is positioned on the lower side of the semiconductor film 201. Then, the semiconductor film 201 turns back to orthogonally intersect again with the above-mentioned gate electrode film 102 (see FIG. 5). The strip-shaped semiconductor film 201 then extends in parallel with the image signal line 104, and is connected to the pad portion 205a formed at the end of the semiconductor film 201 on the C side of FIG. 3.

Figure 4:
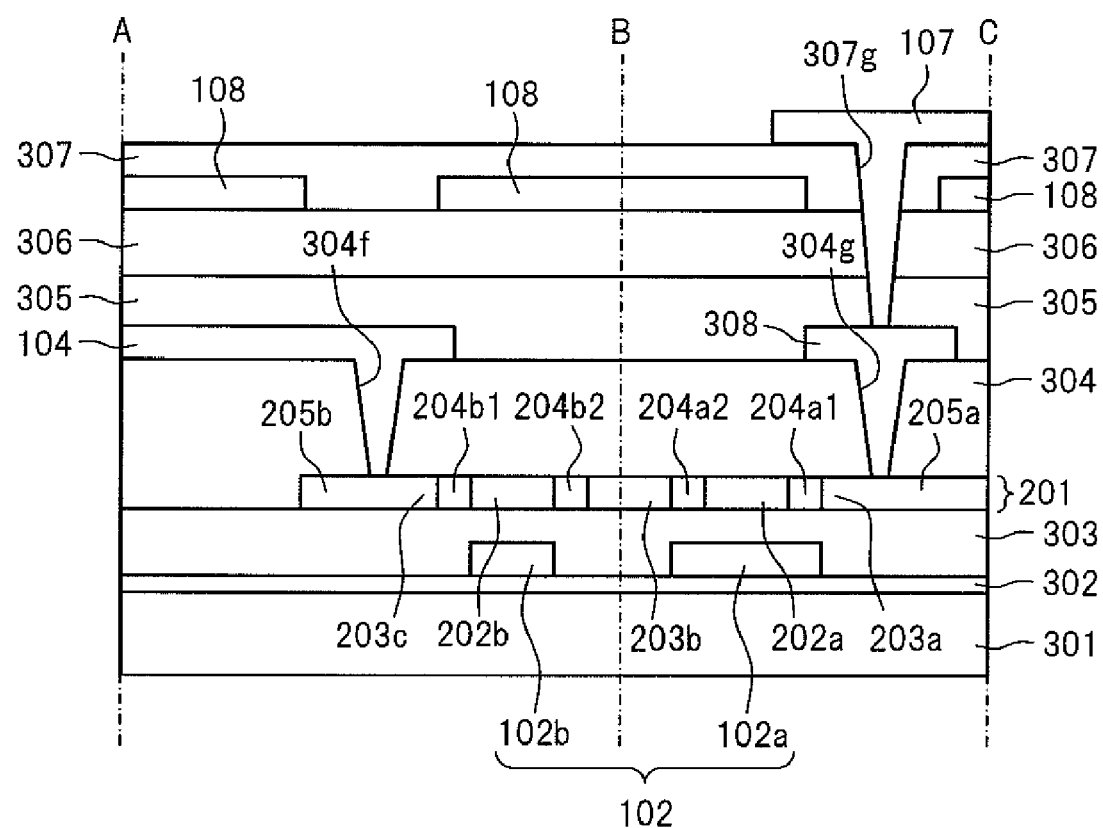
FIG. 4 is a cross-sectional view cut along the line A-B-C of FIG. 3.

FIG. 4 is a cross-sectional view taken along the line A-B-C illustrated in FIG. 3. The semiconductor film 201 includes channel regions 202, and first impurity regions 203 doped with impurities for ensuring conductivity. Between the channel region 202 and the first impurity region 203, there is positioned a second impurity region 204 doped with impurities at lower concentration than the impurity concentration of the first impurity region 203.

In FIG. 4, because the backlight 3 (not shown) is positioned on a lower side of a transparent substrate 301 of FIG. 4, in addition to a role of being applied with the gate voltage, the gate electrode film 102 plays a role of shielding light with respect to a region of the semiconductor film 201, the region being opposed to the gate electrode film 102. Accordingly, the degree of light shielding with respect to the channel region 202 and the second impurity regions 204 differs depending on a relative area of the opposed gate electrode with respect to areas of the channel region 202 and the second impurity regions 204 of the semiconductor film 201. In addition, depending on the area of the region in which the gate electrode film 102 and the semiconductor film 201 are opposed to each other, capacitance varies.

As described above, the semiconductor film 201 is connected to the image signal line 104 from the pad portion 205b formed at the end thereof on the A side of FIG. 4 via the contact hole 304f formed in the interlayer insulation film 304. Similarly, the semiconductor film 201 is connected to the electrode 308 from the pad portion 205a formed at the end thereof on the C side of FIG. 4 via the contact hole 304g formed in the interlayer insulation film 304. The electrode 308 is connected to the pixel electrode 107 via the contact hole 307g formed in the plurality of insulation films 305, 306, and 307, without being electrically connected to the common electrode 108. The pixel electrode 107 is positioned above the common electrode 108, and the plurality of insulation films 305, 306, and 307 are positioned above the electrode 308.

Figure 5:
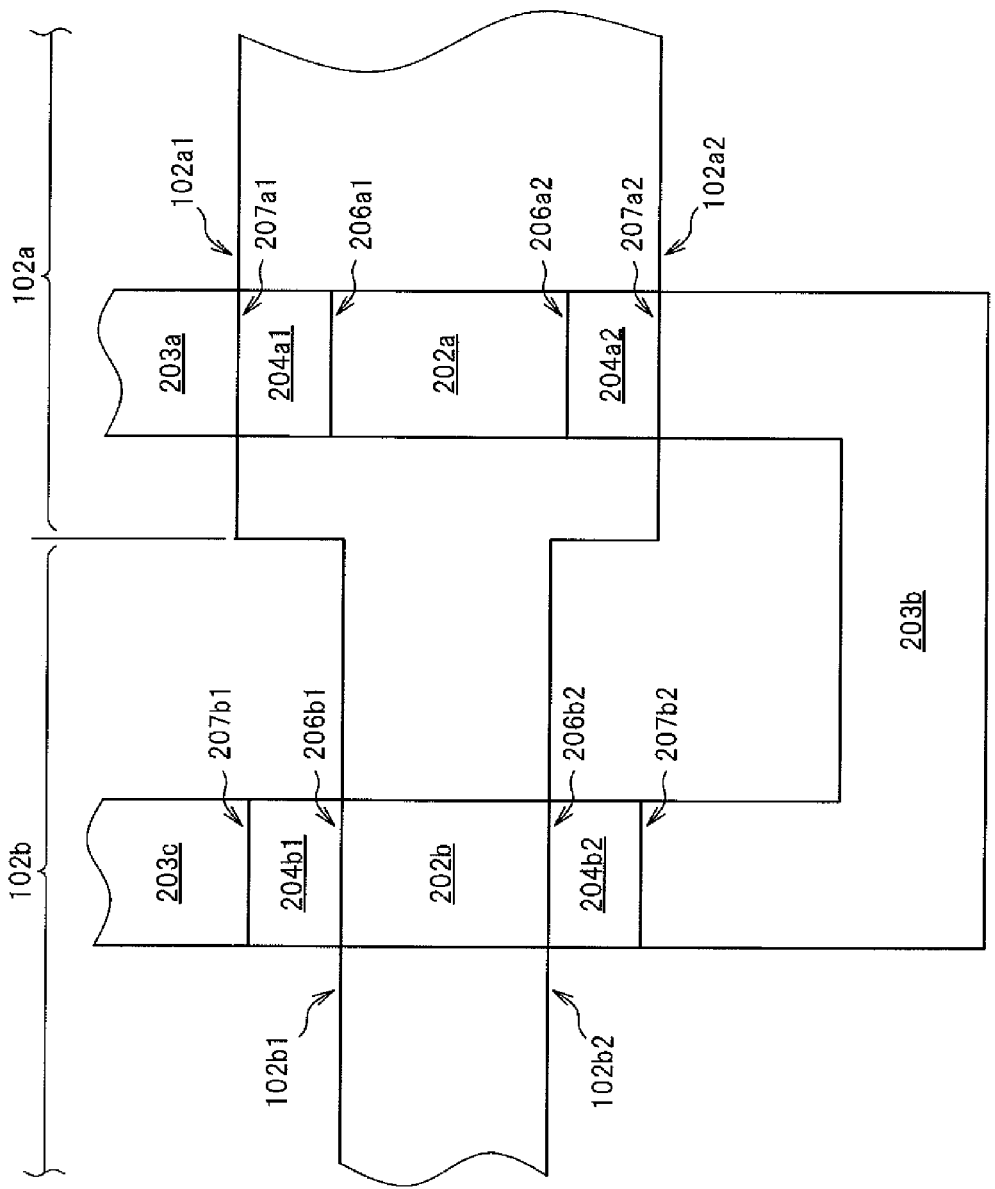
FIG. 5 is an enlarged plan view of a vicinity of TFTs of FIG. 3.

FIG. 5 is an enlarged plan view of a vicinity of the TFTs 106 positioned in the vicinity of B illustrated in FIG. 3. More specific description thereof is given with reference to FIG. 5.

As described above, FIG. 5 is a plan view illustrating the TFTs 106 in which the gate electrode film 102 is positioned below the semiconductor film 201 when viewed from above. The semiconductor film 201 includes the first impurity regions 203, the second impurity regions 204, and the channel regions 202, which are different from one another in amount of doped impurities. There may be a case where the second impurity region 204 is not formed between the channel region 202 and the first impurity region 203.

In FIG. 5, the channel regions 202 are illustrated as a first channel region 202a and a second channel region 202b. Second impurity regions 204a1 and 204a2 are respectively formed in contact with both ends of the first channel region 202a. Further, outside the second impurity regions 204a1 and 204a2, first impurity regions 203a and 203b are respectively formed in contact with the second impurity regions 204a1 and 204a2. Similarly, second impurity regions 204b1 and 204b2 are respectively formed in contact with both ends of the second channel region 202b. Further, outside the second impurity regions 204b1 and 204b2, first impurity regions 203c and 203b are respectively formed in contact with the second impurity regions 204b1 and 204b2.

In the vicinity of the first channel region 202a, a portion (hereinafter referred to as wide gate portion) 102a in which a strip width of the strip-shaped gate electrode film 102 is larger is positioned, while in the vicinity of the second channel region 202b, a portion (hereinafter referred to as narrow gate portion) 102b in which the strip width of the strip-shaped gate electrode film 102 is smaller is positioned. Areas of the regions in which the semiconductor film 201 and the gate electrode film 102 are opposed to each other are different between the wide gate portion 102a and the narrow gate portion 102b.

Regions of the gate electrode film 102 which are opposed to the semiconductor film 201 are referred to as gate regions. In other words, when the semiconductor film 201 is viewed from above, the gate regions correspond to regions of the gate electrode film 102 which are overlapped with the semiconductor film 201 positioned thereabove. Of the gate regions, regions spreading over the first channel region 202a and the second channel region 202b and the vicinities thereof are respectively referred to as a first gate region and a second gate region. In other words, the first gate region corresponds to a region of the gate electrode film 102 which is overlapped with the first channel region 202a and the second impurity regions 204a1 and 204a2 formed in contact therewith which are positioned above the gate electrode film 102. In FIG. 3 and FIG. 5 each illustrating a view from above, the first gate region is overlapped with the first channel region 202a and the second impurity regions 204a1 and 204a2 formed in contact therewith which are positioned above the first gate region, and hence is not illustrated. The same holds true for the second gate region.

In FIG. 5, the wide gate portion 102a includes an upper gate strip end 102a1 and a lower gate strip end 102a2 while the narrow gate portion 102b includes an upper gate strip end 102b1 and a lower gate strip end 102b2. The first channel region 202a is formed in contact with the second impurity regions 204a1 and 204a2 at an upper boundary line 206a1 and a lower boundary line 206a2, respectively. The second impurity regions 204a1 and 204a2 are formed in contact with the first impurity regions 203a and 203b at an upper boundary line 207a1 and a lower boundary line 207a2, respectively. Also in the vicinity of the second channel region 202b, as in the vicinity of the first channel region 202a, the respective regions are formed in contact with one another at boundary lines illustrated in FIG. 5.

As described above, the semiconductor film 201 has the strip shape with the uniform strip width between the pad portions 205b and 205a formed at the both ends thereof. Accordingly, the first channel region 202a and the second channel region 202b are formed to have the same strip width. Further, the first channel region 202a and the second channel region 202b illustrated in FIG. 5 have the same channel length. In other words, a distance between the upper boundary line 206a1 and the lower boundary line 206a2 and a distance between the upper boundary line 206b1 and the lower boundary line 206b2 are equal to each other. In addition, the second impurity regions 204 connected to the both ends of the channel regions 202 have the same region length. In other words, distances between the upper boundary line 206a1 and the upper boundary line 207a1, between the lower boundary line 206a2 and the lower boundary line 207a2, between the upper boundary line 206b1 and the upper boundary line 207b1, and between the lower boundary line 206b2 and the lower boundary line 207b2 are equal to one another.

In the case of FIG. 5, because the upper boundary line 206a1 and the lower boundary line 206a2 are both positioned inside with respect to the upper gate strip end 102a1 and the lower gate strip end 102a2, the first channel region 202a is smaller in area than the first gate region, and accordingly is sufficiently shielded against light by the wide gate portion 102a. In contrast, because the upper boundary line 206b1 and the lower boundary line 206b2 are respectively aligned with the upper gate strip end 102b1 and the lower gate strip end 102b2, the second channel region 202b has the same shape and area as the second gate region, and accordingly is merely shielded against light by the narrow gate portion 102b with no surplus light shielding effect. As a result, the second channel region 202b has a smaller degree of light shielding compared to the first channel region 202a.

However, because the first channel region 202a is sufficiently shielded against light, hole-electron pairs are less likely to be generated in the first channel region 202a, resulting in suppressed optical leakage current. Therefore, even when hole-electron pairs which are generation sources of optical leakage current are generated in the second channel region 202b connected in series with the first channel region 202a, the generated optical leakage current is not allowed to flow through the TFT having the first channel region 202a, resulting in suppressed optical leakage current.

The capacitance of each channel region 202 and the vicinity thereof depends on each area of the region in which the semiconductor film 201 and the gate electrode film 102 are opposed to each other, that is, an area of each gate region. In FIG. 5, as described above, the capacitance of the first channel region 202a is larger than the capacitance of the second channel region 202b.

If the capacitance of each channel region 202 and the vicinity thereof is increased, when the gate voltage is turned off to maintain the pixel voltage, the increased parasitic capacitance causes the pixel voltage to be largely decreased, which results in a new cause of display failure, as described above.

In the structure illustrated in FIG. 5, as compared to the case where the first channel region 202a and the second channel region 202b are both opposed to the wide gate portion 102a, increase in capacitance is more suppressed while optical leakage current is suppressed to a comparable level or a level close to the above-mentioned case.

Similarly, in the structure illustrated in FIG. 5, as compared to the case where the first channel region 202a and the second channel region 202b are both opposed to the narrow gate portion 102b, the generated capacitance is more increased, but generation of optical leakage current is more suppressed.

Further, description is given taking into consideration that hole-electron pairs are generated by light irradiation also in the second impurity region 204, though frequency of the generation thereof is lower than that in the channel region 202.

In the case of FIG. 5, because the upper boundary line 207a1 and the lower boundary line 207a2 are respectively aligned with the upper gate strip end 102a1 and the lower gate strip end 102a2, a region determined by adding together the first channel region 202a and the second impurity regions 204a1 and 204a2 has the same shape and area as the first gate region. Accordingly, the region determined by adding together the first channel region 202a and the second impurity regions 204a1 and 204a2 is shielded against light by the wide gate portion 102a. In contrast, the second impurity regions 204b1 and 204b2 respectively formed at the both ends of the second channel region 202b are not shielded against light by the narrow gate portion 102b.

Taking the second impurity region 204 into consideration, hole-electron pairs causing optical leakage current are considered to be generated further in the vicinity of the second channel region 202b. However, optical leakage current is suppressed in the vicinity of the first channel region 202a, and hence an effect as described above is more enhanced.

Note that a structure is called a lightly doped drain (LDD) structure, in which the second impurity region 204 is positioned between the channel region 202 and the first impurity region 203 to relax an electric field applied in the vicinity of the channel region end (drain end), as in the second channel region 202b and the vicinity thereof. Of the LDD structures, a structure is called a gate overlapped lightly doped drain (GOLD) structure, in which the second impurity region 204 is also positioned above the gate electrode film 102 so that the gate electrode film 102 shields light from the light source with respect also to the second impurity region 204, as in the first channel region 202a and the vicinity thereof.

Next, a method of manufacturing TFTs having the above-mentioned multi-gate structure is described with reference to FIGS. 6A to 6J. Herein, a case of an N-type polycrystalline silicon TFT having a bottom gate structure is described by way of example.

Figure 6A:
FIGS. 6A to 6J illustrate how the TFTs of the liquid crystal display device according to Embodiment 1 are manufactured.

First, on top of the transparent substrate 301, an anti-contamination film 302 for preventing impurity contamination from the transparent substrate 301 is laminated. The transparent substrate 301 is, for example, a glass substrate. The anti-contamination film 302 is formed by depositing, for example, a silicon nitride ($SiN_x$) film through chemical vapor deposition (CVD) (FIG. 6A).

Figure 6B:
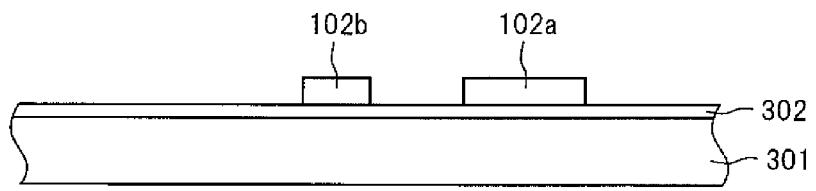

Next, the gate electrode film 102 is formed. It is desirable that the gate electrode film 102 be formed of a conductive material having relatively high melting temperature, such as Mo, W, Ti, Ta, or an alloy thereof, because the gate electrode film 102 is to be heated to high temperature in a subsequent Si-crystallization process. Through a publicly-known lithography process and etching process, a desired shape of the gate electrode film 102 is formed (FIG. 6B). For example, in the case where the gate electrode film 102 has a strip shape, as described with reference to the example of FIG. 5, by forming the gate electrode film 102 into a shape having a strip width that varies among a plurality of TFTs, it becomes possible to vary an area of the region in which the semiconductor film 201 and the gate electrode film 102 are opposed to each other among the TFTs. Note that in FIG. 6B, the gate electrode film is indicated by 102a and 102b.

Figure 6C:
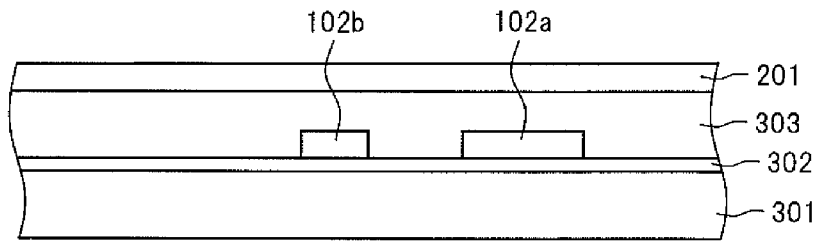

The gate insulation film 303 is formed so as to cover the gate electrode film 102, and further the semiconductor film 201 is formed on top of the gate insulation film 303. The gate insulation film 303 is formed by depositing, for example, a silicon oxide ($SiO_x$) film or a silicon nitride ($SiN_x$) film through CVD or the like. The semiconductor film 201 is formed by first depositing amorphous silicon through CVD, subjecting the amorphous silicon film to a dehydrogenation process and the like, and then performing laser annealing, such as excimer laser annealing, on the resultant amorphous silicon film to be crystallized into polycrystalline silicon (FIG. 6C).

Figure 6D:
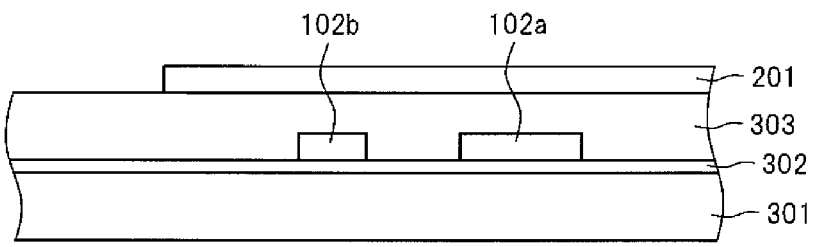

Through the publicly-known lithography process and etching process, the semiconductor film 201 is formed into the shape of the semiconductor film 201 illustrated in FIG. 3 (FIG. 6D).

Figure 6E:
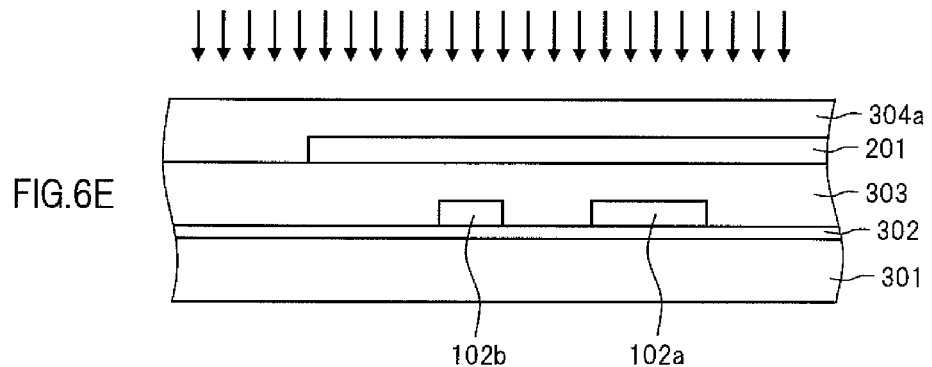

Next, an insulation film 304a is deposited so as to cover the semiconductor film 201. The insulation film 304a is formed by depositing, for example, a silicon oxide ($SiO_x$) film through CVD. Impurities are to be implanted into the semiconductor film 201 via the insulation film 304a, and hence a film thickness of the insulation film 304a is desired to be 200 nm or less. Then, to control a threshold voltage of the TFTs, impurities are implanted into the semiconductor film 201 (FIG. 6E). Impurities used in this case are, for example, phosphorus (P), boron (B), or the like. A plurality of arrows illustrated in the upper portion of FIG. 6E schematically indicate a state of the impurity implantation.

Figure 6F:
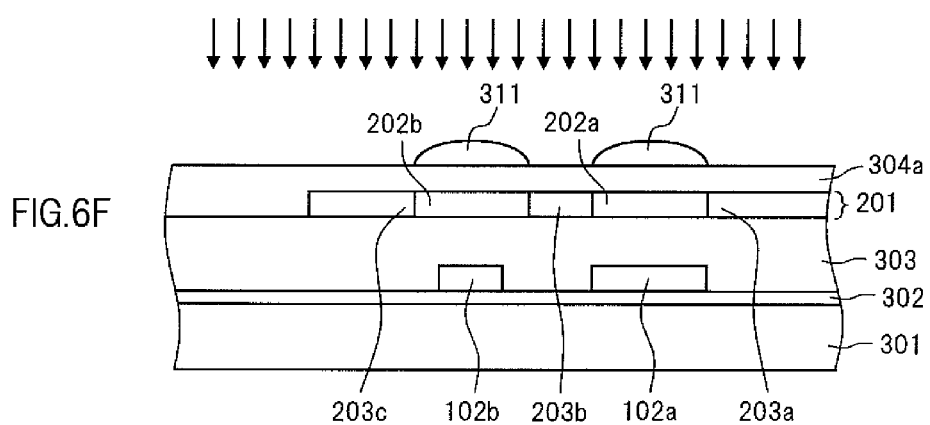

Photoresist is applied on top of the above-mentioned insulation film 304a, and then a pattern is formed in which photoresist 311 is left at predetermined positions above the channel regions 202 and the vicinities thereof which are opposed to the gate electrode film 102. The first impurity regions 203 are formed through impurity implantation performed on the semiconductor film 201 at typical concentration of 1e18 ($atom/cm^3$) or more (FIG. 6F). Impurities used in this case are, for example, phosphorus (P) or the like. As in FIG. 6E, a plurality of arrows illustrated in the upper portion of FIG. 6F schematically indicate a state of the impurity implantation.

Figure 6G:
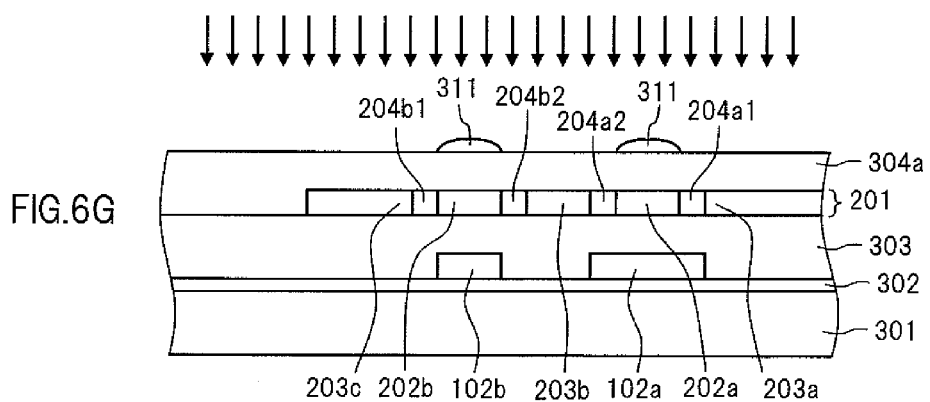

The photoresist 311 is subjected to a reflow process including ashing and thermal treatment to be recessed by a typical length of from 0.5 to 2.0 μm. Then, impurities are implanted into the semiconductor film 201 at typical concentration ranging from 1e16 to 1e19 ($atom/cm^3$), to thereby form the second impurity regions 204 whose doped impurities are lower in concentration than those of the above-mentioned first impurity regions 203 (FIG. 6G). Impurities used in this case are, for example, phosphorous (P) or the like, and are generally the same material as the impurities of the first impurity regions 203. However, there may be a case of a different material from the impurities of the first impurity regions 203. Thereafter, the photoresist 311 is removed through ashing. Note that a plurality of allows illustrated in the upper portion of FIG. 6G indicate similarly as in FIG. 6E and FIG. 6F.

By adjusting the pattern shape of the above-mentioned photoresist 311 and the length to be recessed during the above-mentioned reflow process, there are formed the channel region 202, the second impurity regions 204 that are in contact with the channel region 202, and the first impurity regions 203 that are outside and in contact with the second impurity regions 204 in each TFT illustrated in FIG. 3 or FIG. 5.

Note that through the above-mentioned reflow process, fluctuations in region length among the second impurity regions 204 can be suppressed. Besides, depending on the pattern shape of the above-mentioned photoresist 311, it is also possible to vary the channel length of the channel region 202 among the TFTs. The object of the present invention can be achieved also by varying the channel length through the above-mentioned method rather than by forming the gate electrode film 102 in a shape having the varying strip width of the strip-shaped gate electrode film 102 as illustrated in FIG. 3 and FIG. 5.

Figure 6H:
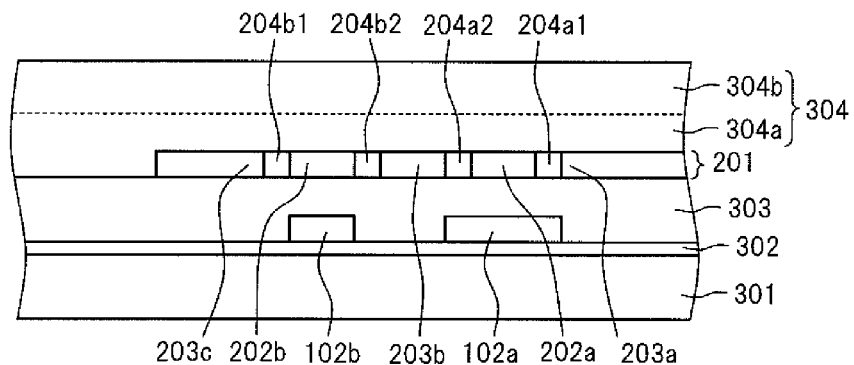

An insulation film 304b is laminated on top of the insulation film 304a, to thereby form the interlayer insulation film 304. The interlayer insulation film 304 is used for suppressing capacitance to be generated between the gate electrode film 102, and the image signal line 104 and the electrode 308. Thereafter, annealing is performed to activate the impurities contained within the first impurity regions 203 and the second impurity regions 204 and to recover crystal defects that are caused during the impurity implantation (FIG. 6H).

Figure 6I:
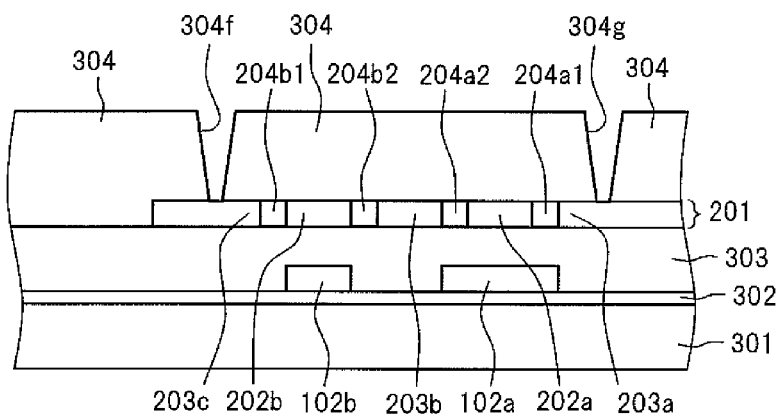

Further, through the publicly-known lithography process and etching process, the contact hole 304f and the contact hole 304g are formed (FIG. 6I).

Figure 6J:
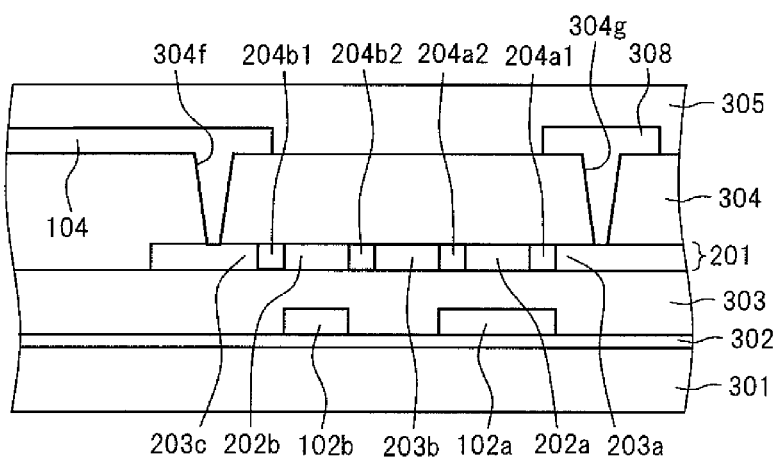

Via the contact hole 304f and the contact hole 304g, the image signal line 104, and the electrode 308 for establishing connection to the pixel electrode 107, are formed. The passivation film 305 is deposited so as to cover the electrode 308, the image signal line 104, and the interlayer insulation film 304. The passivation film 305 is formed by depositing, for example, a silicon nitride ($SiN_x$) film through CVD. Thereafter, annealing is performed to allow hydrogen to bond to dangling bonds existing in the semiconductor film 201, an interface between the semiconductor film 201 and the gate insulation film 303, and the like (FIG. 6J).

Thereafter, as illustrated in FIG. 4, the planarization film 306 and the common electrode 108 are formed. Next, the insulation film 307 is deposited, and the contact hole 307g is formed through the publicly-known lithography process and etching process. Subsequently, the pixel electrode 107 is formed, to thereby form the IPS-mode pixel region.

Embodiment 2

According to the present invention, it is not always necessary to form the above-mentioned second impurity region 204. First, a structure without the above-mentioned second impurity region 204 is described below.

Figure 7A:
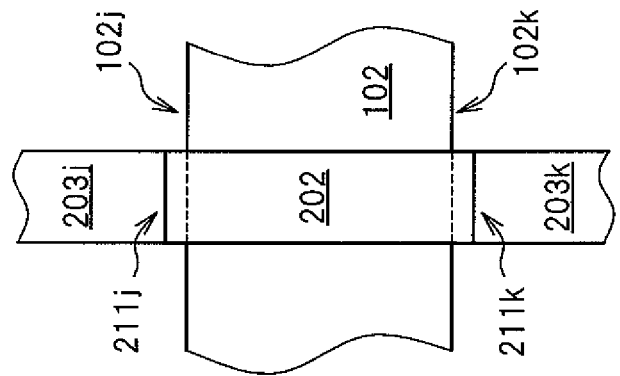
FIGS. 7A to 7C are enlarged plan views each illustrating a semiconductor film including first impurity regions formed in contact with both ends of a channel region, and a gate electrode film positioned below the semiconductor film when viewed from above, in which a distance between a channel region end and a gate electrode film end is uniform between the both ends of the channel region.
Figure 7B:
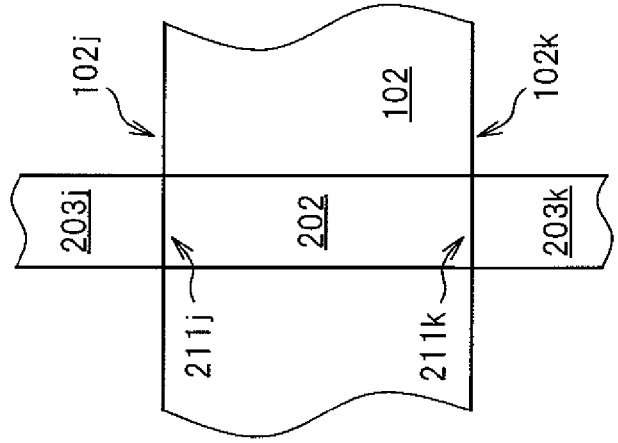
Figure 7C:
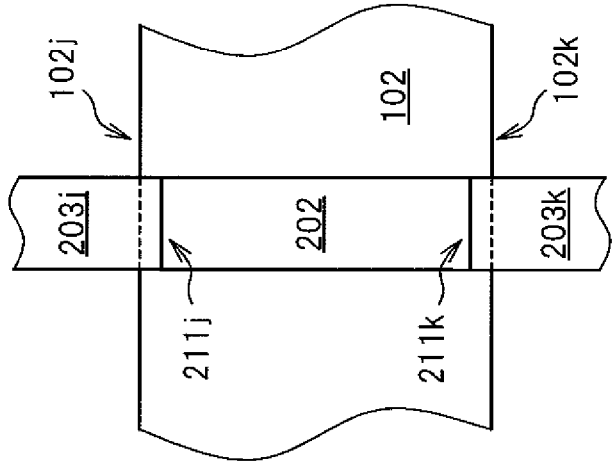

FIGS. 7A to 7C each illustrate a typical relative relation between the gate electrode film 102 formed below and opposed to the semiconductor film 201 and the channel region 202 of the semiconductor film 201 in each TFT. FIGS. 7A to 7C each illustrate the semiconductor film 201 in which first impurity regions 203j and 203k are respectively formed in contact with the both ends of the channel region 202. The both ends of the channel region 202 are respectively denoted by 211j and 211k. The gate electrode film 102 is positioned below the semiconductor film 201, and the semiconductor film 201 and the gate electrode film 102 are opposed to each other in the channel region 202 and the vicinity thereof. The both ends of the gate electrode film 102 are respectively denoted by 102j and 102k. As described above, the region of the gate electrode film 102 which is opposed to the semiconductor film 201 is referred to as the gate region.

In FIG. 7A, the channel ends 211j and 211k are both positioned inside with respect to the upper and lower gate strip ends 102j and 102k, and hence the channel region 202 is smaller in area than the gate region. Accordingly, the channel region 202 is sufficiently shielded against light by the gate electrode film 102.

Similarly, in FIG. 7B, because the channel ends 211*j* and 211*k* are respectively aligned with the upper and lower gate strip ends 102*j* and 102*k*, the channel region 202 has the same area as the gate region, and accordingly the channel region 202 is shielded against light by the gate electrode film 102.

In FIG. 7C, the channel ends 211*j* and 211*k* are both positioned outside with respect to the upper and lower gate strip ends 102*j* and 102*k*, and hence the channel region 202 is larger in area than the gate region. Accordingly, the channel region 202 is not sufficiently shielded against light by the gate electrode film 102.

The capacitance of each TFT largely depends on an area of the region in which the semiconductor film 201 and the gate electrode film 102 are opposed to each other of the TFT. FIGS. 7A to 7C illustrate the channel regions 202 having the same shape and area, and hence as the strip width of the gate electrode film 102, that is, a distance between the upper and lower gate strip ends 102*j* and 102*k* is larger, the area of the region in which the semiconductor film 201 and the gate electrode film 102 are opposed to each other becomes larger to increase the degree of light shielding, but at the same time, to increase the capacitance.

In a case where the first channel region 202*a* has the structure illustrated in FIG. 7A, the second channel region 202*b* may have any one of the structures illustrated in FIGS. 7A to 7C because a relative area of the gate region with respect to the channel region 202 is differently set according to the channel region 202 in the present invention. In the case where the second channel region 202*b* has the structure illustrated in FIG. 7A, there may be cases where an area difference between the second channel region 202*b* and the second gate region is smaller than an area difference between the first channel region 202*a* and the first gate region, and vice versa. In those cases, the TFT including the gate region spreading outward more from the channel region 202 has a larger degree of light shielding and a relatively increased capacitance.

In the case where the second channel region 202*b* has the structure of FIG. 7A in which the area difference between the second channel region 202*b* and the second gate region is smaller than the area difference between the first channel region 202*a* and the first gate region, or where the second channel region 202*b* has one of the structures of FIGS. 7B and 7C, the TFT including the first channel region 202*a* has a larger degree of light shielding and contributes to suppressed optical leakage current. On the other hand, the TFT including the second channel region 202*b* has a structure for giving a higher priority to suppression of increase in capacitance than to suppression of hole-electron pair generation.

In the case where the second channel region 202*b* has the structure of FIG. 7A in which the area difference between the second channel region 202*b* and the second gate region is larger than the area difference between the first channel region 202*a* and the first gate region, conversely, the TFT including the second channel region 202*b* has a larger degree of light shielding and contributes to suppressed optical leakage current. On the other hand, the TFT including the first channel region 202*a* has a structure for giving a higher priority to suppression of increase in capacitance.

As other structural combinations different from the structural combination described above, there may be cases where the first channel region 202*a* has the structure of FIG. 7B while the second channel region 202*b* has the structure of FIG. 7C, and where both of the first channel region 202*a* and the second channel region 202*b* have the structure of FIG. 7C.

In the former case, similarly to the above, the TFT including the first channel region 202*a* contributes to suppressed optical leakage current, whereas the TFT including the second channel region 202*b* has a structure for giving a higher priority to suppression of increase in capacitance.

In the latter case, the TFT having a smaller area difference between the channel region 202 and the gate region contributes more to suppressed optical leakage current, whereas the TFT having a larger area difference therebetween has a structure for giving a higher priority to suppression of increase in capacitance. This is because, in the case where the TFTs have the structure of FIG. 7C, though the channel regions 202 are not sufficiently shielded against light by the gate electrode film 102, the TFT having the smaller area difference has a larger degree of light shielding than the TFT having the larger area difference, and contributes relatively more to increased capacitance.

Embodiment 3

In Embodiment 2 described above, for the sake of easy understanding of the concept, the description has been given of the case where a relative positional relation between the channel end 211*j* and the upper gate strip end 102*j* is identical with a relative positional relation between the channel end 211*k* and the lower gate strip end 102*k* in each of FIGS. 7A to 7C. However, there may be a case where both of the respective ends have different structures.

Some examples are illustrated in FIGS. 8A to 8E, but the above-mentioned case is not limited to the illustrated examples. In a case where the channel end 211*j* (or 211*k*) is positioned inside with respect to the upper gate strip end 102*j* (or lower gate strip end 102*k*), as a distance between both the ends is larger, the degree of light shielding becomes larger, thereby contributing relatively more to increased capacitance. On the other hand, in a case where the channel end 211*j* (or 211*k*) is positioned outside with respect to the upper gate strip end 102*j* (or lower gate strip end 102*k*), as the distance between both the ends is smaller, the degree of light shielding becomes larger, thereby contributing relatively more to increased capacitance.

Embodiment 4

Next, a structure in which the above-mentioned second impurity regions 204 are respectively formed in contact with the both ends of the channel region 202 is described.

FIGS. 9A to 9E each illustrate a typical relative relation between the gate electrode film 102 positioned below and opposed to the semiconductor film 201 and the channel region 202 and the second impurity regions 204 of the semiconductor film 201 in one TFT.

Also in this case, the same description as in Embodiment 2 can be given in view of the fact that hole-electron pairs are more likely to be generated by light irradiation in the channel region 202 than in the second impurity region 204.

Further, the same description as in Embodiment 2 can be given also in view of the fact that hole-electron pairs are more likely to be generated by light irradiation in the second impurity region 204 than in the first impurity region 203, in which a relative positional relation between the upper gate strip end 102*j* and a boundary line 213*j* between the second impurity region 204 and the first impurity region 203, and a relative positional relation between the lower gate strip end 102*k* and a boundary line 213*k* between the second impurity region 204 and the first impurity region 203 in each of FIGS. 9A to 9E may be described instead of the relative positional relations between the channel end 211*j* of the channel region 202 and the upper gate strip end 102*j* and between the channel end 211*k* of the channel region 202 and the lower gate strip end 102*k* in each of FIGS. 7A to 7C of Embodiment 2.

Embodiment 5

In Embodiment 4, as in Embodiment 2, the description has been given of the case where the relative positional relation between the upper gate strip end 102*j* and the boundary lines 212*j* and 213*j* is identical with the relative positional relation between the lower gate strip end 102*k* and the boundary lines 212*k* and 213*k* in each of FIGS. 9A to 9E. However, there may be a case where both of the respective ends have different structures.

Specifically, in a case where the boundary line 213*j* (or 213*k*) is positioned inside with respect to the upper gate strip end 102*j* (or lower gate strip end 102*k*), as a distance between the boundary line and the gate strip end is larger, the degree of light shielding becomes larger, thereby contributing relatively more to increased capacitance. On the other hand, in a case where the boundary line 213*j* (or 213*k*) is positioned outside with respect to the upper gate strip end 102*j* (or lower gate strip end 102*k*), as a distance between the boundary line and the gate strip end is smaller, the degree of light shielding becomes larger, thereby contributing relatively more to increased capacitance.

Embodiment 6

Further, respectively in Embodiment 2 and Embodiment 4, the description has been given of the case where no second impurity region 204 described above is formed in contact with the both ends of the channel region 202 and the case where the second impurity regions 204 described above are respectively formed in contact with the both ends of the channel region 202. However, there may be a case where the above-mentioned second impurity region 204 is formed in contact with one of the both ends of the first channel region 202*a* or the second channel region 202*b*. Moreover, also in this case, there may be a case where both of the respective channel ends have different structures.

Figure 10A:
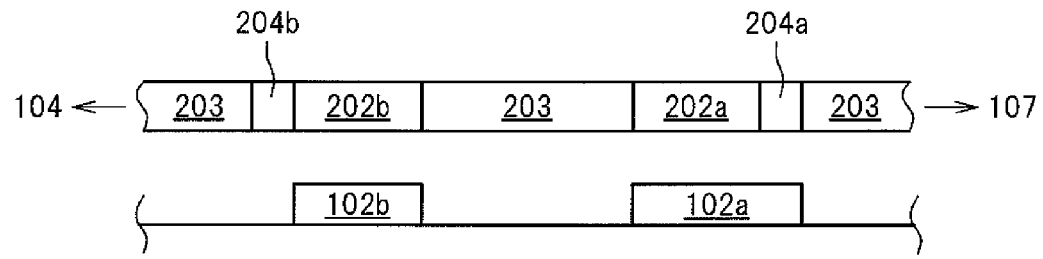
FIGS. 10A to 10C are schematic views each illustrating a structure of two TFTs having a multi-gate structure.

An embodiment of this case is illustrated in a schematic view of FIG. 10A. FIG. 10A illustrates a multi-gate structure in which two TFTs are connected in series. The second impurity region 204*a* is formed in contact with one end of the first channel region 202*a* whereas no second channel region 204*a* is formed in contact with another end thereof. A region determined by adding together the first channel region 202*a* and the second impurity region 204*a* formed in contact therewith has the same area as the first gate region. Accordingly, the first channel region 202*a* and the second impurity region 204*a* are shielded against light by the gate electrode film 102*a*, resulting in suppressed optical leakage current.

Similarly, the second impurity region 204*b* is formed in contact with only one end of the second channel region 202*b*. The second impurity region 204*b* is positioned outside the second gate region, and hence the second impurity region 204*b* is not shielded against light by the gate electrode film 102*b*, which causes hole-electron pairs to be more likely to be generated. However, optical leakage current is suppressed in a right end of the first channel region 202*a* of FIG. 10A with the aid of the right end of the first channel region 202*a* of FIG. 10A and the second impurity region 204*a* formed in contact therewith. On the other hand, the second impurity region 204*b* is not opposed to the gate electrode film 102*b*, resulting in suppressed increase in capacitance in the second channel region 202*b* and the vicinity thereof.

Embodiment 7

Figure 9E:
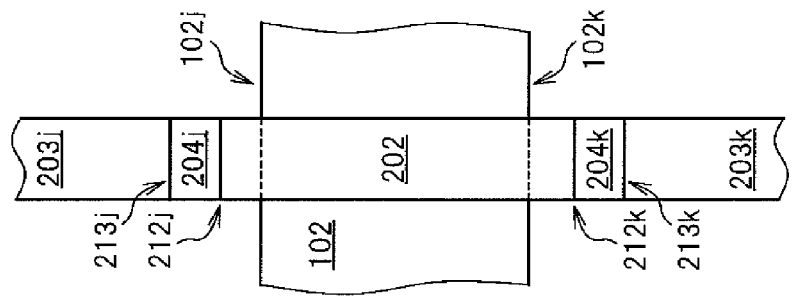
FIGS. 9A to 9E are enlarged plan views each illustrating the semiconductor film in which second impurity regions are formed in contact with the both ends of the channel region, and the first impurity regions are formed outside and in contact with the second impurity regions, and the gate electrode film positioned below the semiconductor film when viewed from above.
Figure 9D:
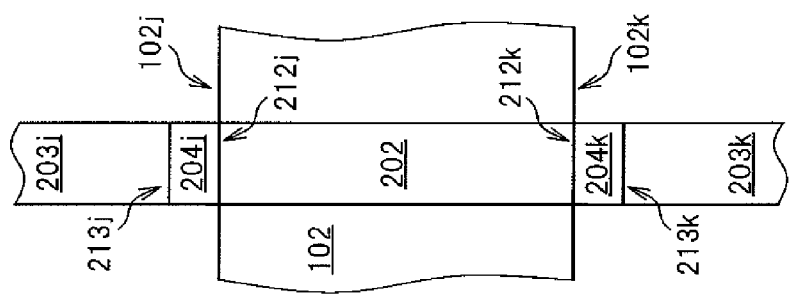
Figure 9C:
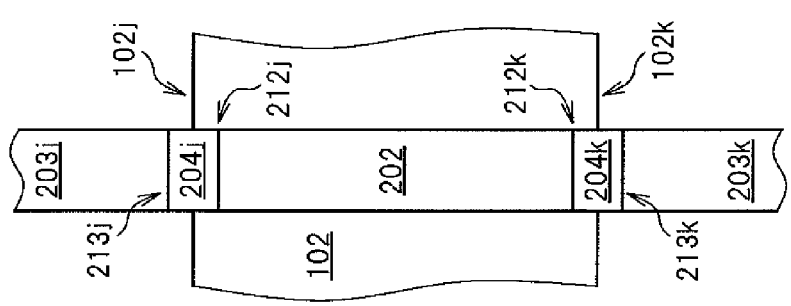
Figure 9B:
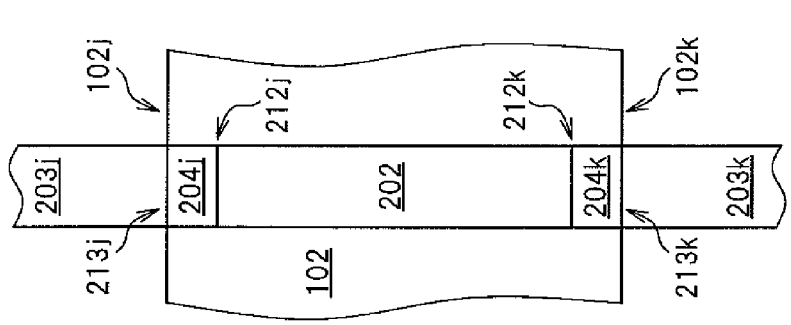
Figure 9A:
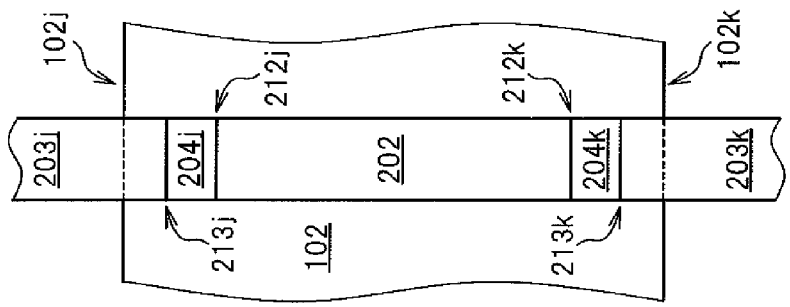

Description is given as being limited to the case where the first gate region is larger in area than the first channel region 202*a*. In this case, when the second impurity regions 204*a* are formed in contact with the both ends of the first channel region 202*a*, any one of the structures of FIG. 9A, FIG. 9B, and FIG. 9C is employed.

In this case, the first channel region 202*a* and the vicinity thereof are shielded against light by the gate electrode film 102*a*, and act to contribute to suppressed optical leakage current. As described above, this structure may act to more suppress optical leakage current when employed in the second channel region 202*b* than in the first channel region 202*a*. In this case, conversely, the first channel region 202*a* and the vicinity thereof have a structure for more suppressing increase in capacitance.

Figure 10B:
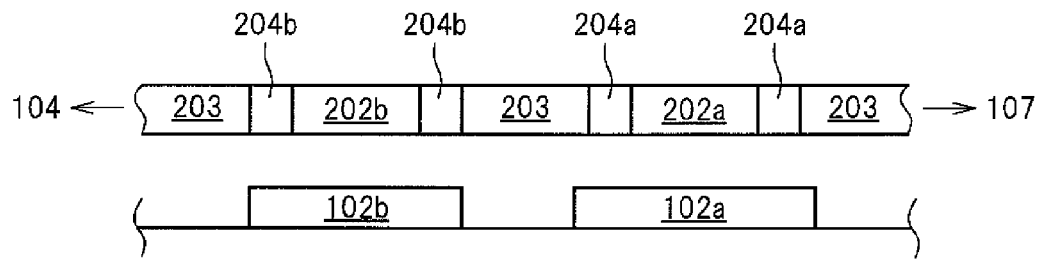

An embodiment of this case is illustrated in a schematic view of FIG. 10B. FIG. 10B illustrates a multi-gate structure in which two TFTs are connected in series. The second impurity regions 204*a* and the second impurity regions 204*b* are respectively formed in contact with the both ends of the first channel region 202*a* and the second channel region 202*b*. The first channel region 202*a* has the structure of FIG. 9A whereas the second channel region 202*b* has the structure of FIG. 9B.

In this case, the first channel region 202*a* and the vicinity thereof work to suppress optical leakage current, and as compared to the first channel region 202*a* and the vicinity thereof, the second channel region 202*b* and the vicinity thereof have a smaller degree of light shielding, but have a smaller capacitance.

Embodiment 8

Description is given as being further limited to the case where the second channel region 202*b* is larger in area than the second gate region in the case where no second impurity region 204*b* is formed in contact with the second channel region 202*b*, or where a region determined by adding together the second channel region 202*b* and the second impurity region 204*b* is larger in area than the second gate region in the case where the second impurity region 204*b* is formed in contact with the second channel region 202*b* in Embodiment 7. In this case, when the second impurity regions 204*b* are formed in contact with the both ends of the second channel region 202*b*, any one of the structures of FIG. 9C, FIG. 9D, and FIG. 9E is employed.

In this case, the second channel region 202*b* and the vicinity thereof are not sufficiently shielded against light by the gate electrode film 102*b*, but work to decrease the capacitance. As described above, this case also includes the case where both of the first channel region 202*a* and the second channel region 202*b* have the structure of FIG. 9C.

Figure 10C:
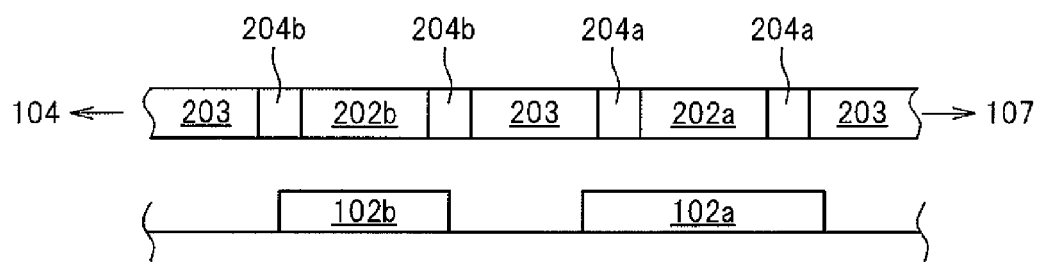

An embodiment of this case is illustrated in a schematic view of FIG. 10C. FIG. 10C illustrates a multi-gate structure in which two TFTs are connected in series. The second impurity regions 204*a* and the second impurity regions 204*b* are respectively formed in contact with the both ends of the first channel region 202*a* and the second channel region 202*b*. The first channel region 202*a* has the structure of FIG. 9A whereas the second channel region 202*b* has the structure of FIG. 9C.

Further, the case where the first channel region 202*a* has the structure of FIG. 9B whereas the second channel region 202b has the structure of FIG. 9D, which has been described with reference to FIG. 5 and the like, also applies to this embodiment.

Further, the case of FIG. 10A described above also applies to the case where the second impurity regions 204a and 204b are respectively formed in contact with only one ends of the first channel region 202a and the second channel region 202b, and hence the same effect is obtained.

Embodiment 9

Description is given as being further limited to the case where the first channel region 202a corresponds to a channel region which is positioned closest to the pixel electrode 107 among the plurality of series-connected channel regions 202 that are included in regions of the semiconductor film 201, which have the strip shape, in Embodiment 8. The reason for this limitation is due to the fact that display failure caused by optical leakage current often occurs when leakage current is generated while the pixel electrode 107 is maintained at a higher potential to cause the potential of the pixel electrode 107 to be decreased.

Specifically, the reason for the limitation is as follows. When the pixel electrode 107 is maintained at a higher potential, in the vicinity of a channel region end which is positioned on a side closer to the pixel electrode 107, a stronger electric field is often generated than in other channel region ends. Hole-electron pairs existing in the vicinity of the channel region end are often separated into holes and electrons by the strong electric field, resulting in increased leakage current.

Therefore, when the first channel region 202a having a higher light shielding effect to suppress optical leakage current is positioned closest to the pixel electrode 107 among the plurality of series-connected channel regions 202, the effect of suppressing optical leakage current is enhanced.

Figure 10D:
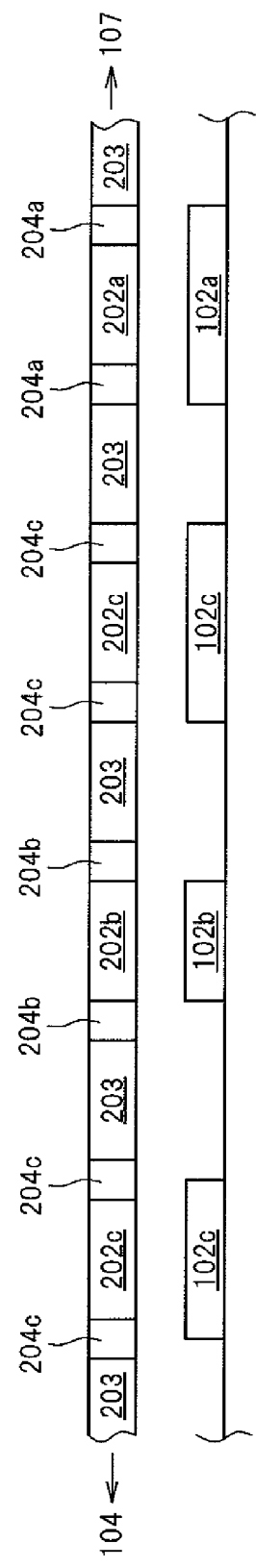
FIGS. 10D and 10E are schematic views each illustrating a structure of four TFTs having a multi-gate structure.

An embodiment of this case is illustrated in a schematic view of FIG. 10D. FIG. 10D illustrates a multi-gate structure in which four TFTs are connected in series. A right end of the semiconductor film 201 of FIG. 10D is connected to the pixel electrode 107 while a left end thereof is connected to the image signal line 104. Among four channel regions 202, the first channel region 202a is positioned on the rightmost side of FIG. 10D, that is, the side closest to the pixel electrode 107. The second channel region 202b is positioned as any one of the three channel regions 202 other than the first channel region 202a. FIG. 10D illustrates the case where the second channel region 202b is positioned second closest to the left end of FIG. 10D. The second impurity regions 204 are formed in contact with the respective both ends of the channel regions 202.

In FIG. 10D, the first channel region 202a has the structure of FIG. 9B whereas the second channel region 202b has the structure of FIG. 9D. Among other channel regions 202c of FIG. 10D, a channel region 202c positioned second closest to the right end of FIG. 10D has the structure of FIG. 9B, and a channel region 202c positioned closest to the left end of FIG. 10D has the structure of FIG. 9C.

In this case, the first channel region 202a and the vicinity thereof work to suppress optical leakage current, and as compared to the first channel region 202a and the vicinity thereof, the second channel region 202b and the vicinity thereof have a smaller degree of light shielding, but have a smaller capacitance. In addition, the first channel region 202a is positioned on the side closest to the pixel electrode 107, resulting in an enhanced effect of suppressing the optical leakage current.

Further, as another embodiment, there may be a case where the right end and the left end of the semiconductor film 201 of each of FIG. 10B and FIG. 10C that have been described above are respectively connected to the pixel electrode 107 and the image signal line 104. In this case, the first channel region 202a is positioned on the pixel electrode 107 side while the second channel region 202b is positioned on the image signal line 104 side. Further, similarly to the above, also in the structure illustrated in FIG. 5, the first channel region 202a is positioned on the pixel electrode 107 side while the second channel region 202b is positioned on the image signal line 104 side. Note that the same positional relation applies to the case where the semiconductor film 201 of FIG. 10A that has been described above has the same connection.

Embodiment 10

Description is given as being further limited to the case where the channel region 202c is larger in area than a gate region spreading over the channel region 202c and the vicinity thereof in the case where no second impurity region 204c is formed in contact with each of the channel regions 202c other than the first channel region 202a, or where a region determined by adding together the channel region 202c and the second impurity region 204c is larger in area than the above-mentioned gate region in the case where the second impurity region 204c is formed in contact with each of the channel regions 202c in Embodiment 9. Similarly to the above, in this case, when the second impurity regions 204c are formed in contact with the both ends of the channel region 202c, the channel region 202c and the vicinity thereof have any one of the structures of FIG. 9C, FIG. 9D, and FIG. 9E.

Optical leakage current is suppressed with the aid of the first channel region 202a and the vicinity thereof having a higher light shielding effect, which makes it possible to allow the channel regions 202c other than the first channel region 202a to have a structure for suppressing increase in capacitance. As a result, it becomes possible to prevent display failure due to increased capacitance while suppressing optical leakage current.

Figure 10E:
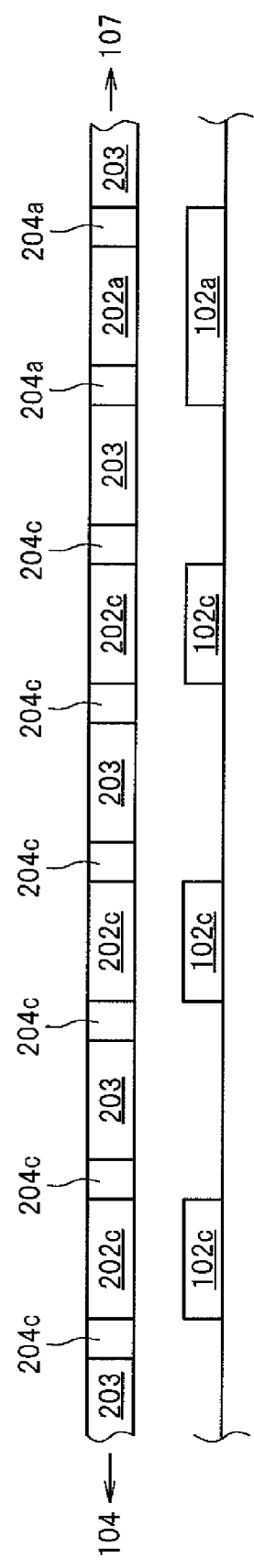

An embodiment of this case is illustrated in a schematic view of FIG. 10E. FIG. 10E illustrates a multi-gate structure in which four TFTs are connected in series. The first channel region 202a positioned on the side closest to the pixel electrode 107 among the four channel regions has the structure of FIG. 9B whereas each of the other channel regions 202c has the structure of FIG. 9D.

In this case, the first channel region 202a and the vicinity thereof work to suppress optical leakage current, and as compared to the first channel region 202a and the vicinity thereof, all of the other channel regions 202c and the vicinities thereof have a smaller capacitance. In addition, the first channel region 202a is positioned on the side closest to the pixel electrode 107, resulting in an enhanced effect of suppressing the optical leakage current. As a result, the remarkable effect of suppressing increase in capacitance while suppressing optical leakage current is obtained in this embodiment.

Note that this embodiment is also applied to the case of the two TFTs having the multi-gate structure, which has been described in Embodiment 9 with reference to FIG. 10A, FIG. 10C, and FIG. 5.

Embodiment 11

The present invention employs a structure in which an area of a region in which the semiconductor film 201 and the gate electrode film 102 are opposed to each other varies among the plurality of TFTs. As described with reference to FIG. 3 and FIG. 5, the gate electrode film 102 may have a strip shape.

When the strip shape is selectively varied in width among the plurality of TFTs, the area of the region in which the semiconductor film 201 and the gate electrode film 102 are opposed to each other is varied.

Figure 11:
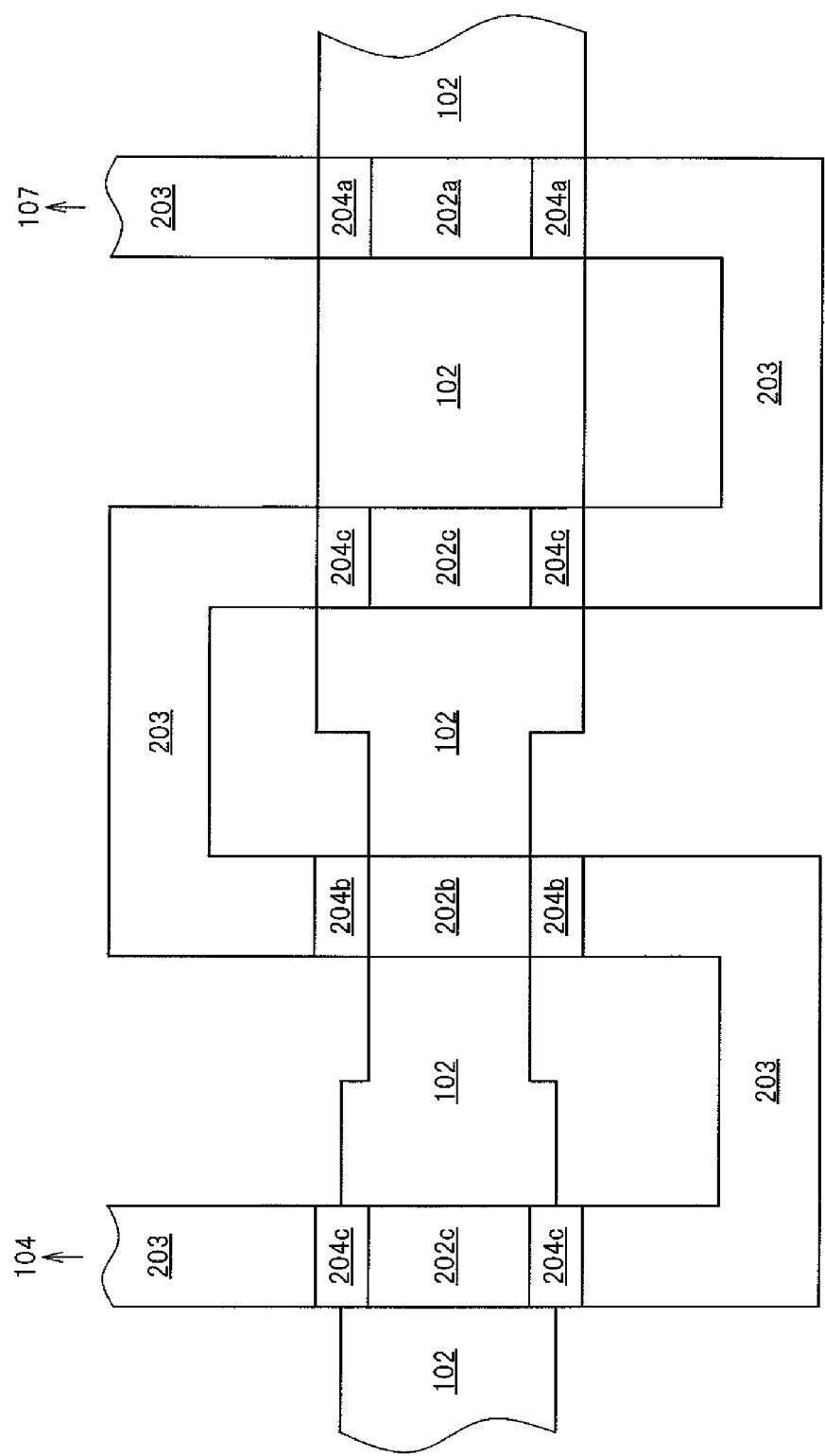
FIG. 11 is an enlarged plan view of the TFTs having the structure of FIG. 10D when viewed from above.

An embodiment of the shape of the gate electrode film 102 in this case is illustrated in FIG. 11. FIG. 11 is an enlarged plan view of the four TFTs having the multi-gate structure illustrated in FIG. 10D when viewed from above.

The gate electrode film 102 has the strip shape which varies in strip width among the TFTs. The gate insulation film 303 is laminated on top of the gate electrode film 102 having the above-mentioned shape, and a predetermined semiconductor film 201 is formed thereon. In FIG. 11, the TFTs have the same strip width and channel length of the channel region 202 and the same region length of the second impurity region 204. In other words, the TFTs have the same shape and area of the channel region 202 and the same shape and area of the second impurity region 204 formed in contact with the channel region 202. In this case, the TFTs have the same shape of the semiconductor film 201, but may be different in structure because of the shape of the gate electrode film 102 which varies in strip width.

Note that the TFTs may be manufactured so as to be different from one another in structure by adjusting the pattern with which the photoresist 311 is applied thereon, which has been described with reference to FIG. 6F and FIG. 6G, rather than by varying the strip width of the gate electrode film 102, or by a combination of both methods.

Embodiment 12

Figure 12:
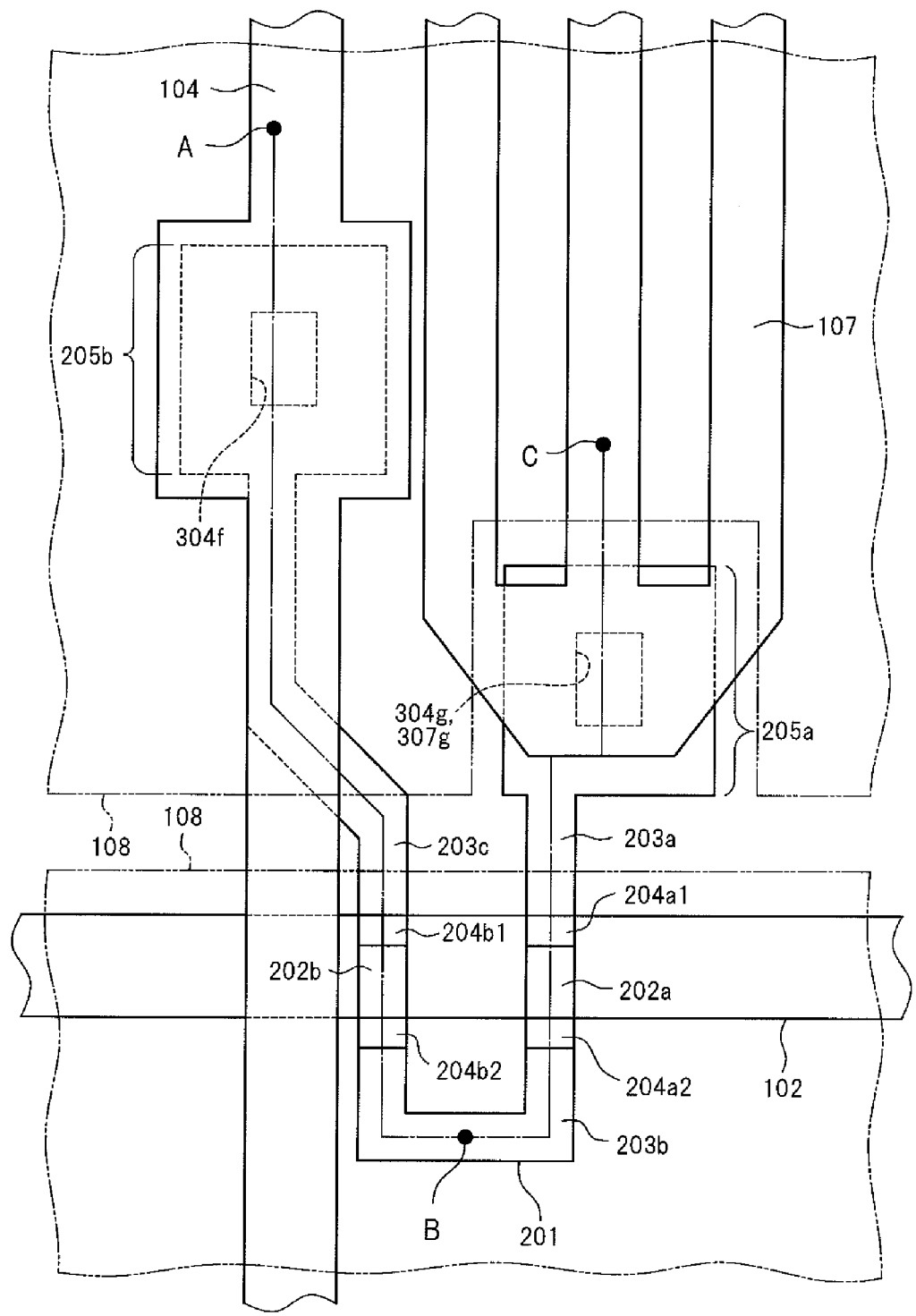
FIG. 12 is an enlarged plan view of one pixel region of a TFT substrate according to Embodiment 12 of the present invention.

FIG. 12 is an enlarged plan view of one pixel region of the TFT substrate 2. In FIG. 12, a semiconductor film 201 is provided. A pad portion 205*b* is formed at an end of the semiconductor film 201 on the A side of FIG. 12 and an interlayer insulation film 304 is formed over the pad portion 205*b*. The interlayer insulation film 304 has a contact hole 304*f* formed therein. The pad portion 205*b* is connected to the image signal line 104 through a high conductive material, such as aluminum. On the other hand, a pad portion 205*a* is formed at an end of the semiconductor film 201 on the C side of FIG. 12, and an interlayer insulation film 304 formed over the pad portion 205*a* also has a contact hole 304*g* formed therein. Further, a plurality of insulation films 305, 306, and 307 formed above the interlayer insulation film 304 also have a contact hole 307*g* formed therein. The pad portion 205*a* is connected via an electrode 308 formed thereabove to the pixel electrode 107 formed above the common electrode 108 which is positioned above the electrode 308, without being electrically connected to the common electrode 108. On a lower side of the semiconductor film 201, a gate electrode film 102 is positioned via a gate insulation film 303, to thereby form the gate signal line 102 (see FIG. 13).

The semiconductor film 201 has a strip shape with a uniform strip width between the pad portions 205*b* and 205*a* formed at the both ends thereof. From the pad portion 205*b* formed at the end of the semiconductor film 201 on the A side of FIG. 12, the strip-shaped semiconductor film 201 extends below and in parallel with the image signal line 104, and then is formed along an oblique line to deviate away from below the image signal line 104. The semiconductor film 201 extends again in parallel with the image signal line 104. The semiconductor film 201 orthogonally intersects, via the gate insulation film 303, with the strip-shaped gate electrode film 102 which is positioned on the lower side of the semiconductor film 201. Then, the semiconductor film 201 turns back to orthogonally intersect again with the above-mentioned gate electrode film 102 (see FIG. 14). The strip-shaped semiconductor film 201 then extends in parallel with the image signal line 104, and is connected to the pad portion 205*a* formed at the end of the semiconductor film 201 on the C side of FIG. 12.

Figure 13:
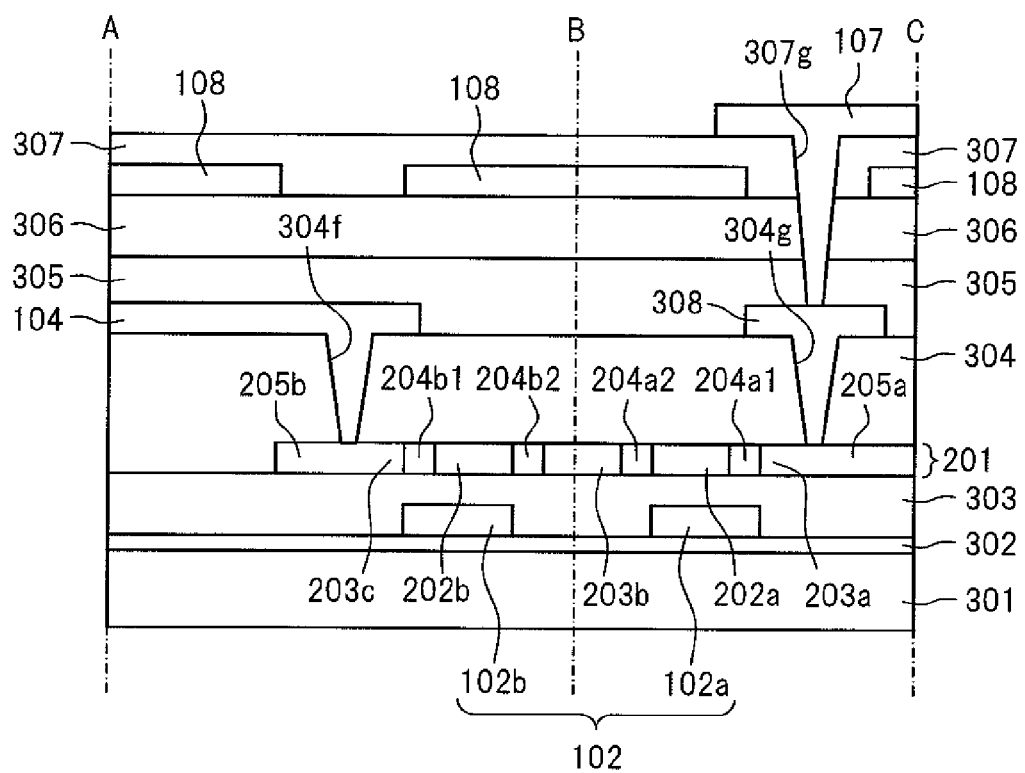
FIG. 13 is a cross-sectional view cut along the line A-B-C of FIG. 12.

FIG. 13 is a cross-sectional view taken along the line A-B-C illustrated in FIG. 12. The semiconductor film 201 includes channel regions 202, and first impurity regions 203 doped with impurities for ensuring conductivity. Between the channel region 202 and the first impurity region 203, there is positioned a second impurity region 204 doped with impurities at lower concentration than the impurity concentration of the first impurity region 203.

In FIG. 13, because the backlight 3 (not shown) is positioned on a lower side of a transparent substrate 301 of FIG. 13, in addition to a role of being applied with the gate voltage, the gate electrode film 102 plays a role of shielding light with respect to a region of the semiconductor film 201, the region being opposed to the gate electrode film 102. Accordingly, the degree of light shielding with respect to end portions of the channel region 202 and the second impurity regions 204 differs depending on a relative position of gate ends of the opposed gate electrode film 102 with respect to the channel ends of the channel region 202 and the second impurity regions 204. In addition, depending on the area of the region in which the gate electrode film 102 and the semiconductor film 201 are opposed to each other, the capacitance varies.

As described above, the semiconductor film 201 is connected to the image signal line 104 from the pad portion 205*b* formed at the end thereof on the A side of FIG. 13 via the contact hole 304*f* formed in the interlayer insulation film 304. Similarly, the semiconductor film 201 is connected to the electrode 308 from the pad portion 205*a* formed at the end thereof on the C side of FIG. 13 via the contact hole 304*g* formed in the interlayer insulation film 304. Further, the electrode 308 is connected to the pixel electrode 107 via the contact hole 307*g* formed in the plurality of insulation films 305, 306, and 307, without being electrically connected to the common electrode 108. The pixel electrode 107 is positioned above the common electrode 108, and the plurality of insulation films 305, 306, and 307 are positioned above the electrode 308.

FIG. 14 is an enlarged plan view of a vicinity of the TFTs 106 positioned in the vicinity of B illustrated in FIG. 12. More specific description thereof is given with reference to FIG. 14.

As described above, FIG. 14 is a plan view illustrating the TFTs 106 in which the gate electrode film 102 is positioned below the semiconductor film 201 when viewed from above.

First, the semiconductor film 201 is described. In FIG. 14, the semiconductor film 201 has the strip shape with the uniform strip width, and includes the first impurity regions 203, the second impurity regions 204, and the channel regions 202, which are different from one another in amount of doped impurities.

In FIG. 14, the channel regions 202 are illustrated by a first channel region 202*a* and a second channel region 202*b*. In the strip-shaped semiconductor film 201, the first channel region 202*a* and the second channel region 202*b* are formed in series via a first impurity region 203*b* and the like. The first channel region 202*a* is connected to the pixel electrode 107 via a first impurity region 203*a* while the second channel region 202*b* is connected to the image signal line 104 via a first impurity region 203*c*.

The first channel region 202*a* includes a channel end 206*a*1 formed on the upper side of FIG. 14 and a channel end 206*a*2 formed on the lower side of FIG. 14. Similarly, the second channel region 202b includes a channel end 206b1 and a channel end 206b2 at both ends thereof. The channel end 206a1 corresponds to an end of the first channel region 202a on the pixel electrode 107 side, and is hereinafter referred to as a first channel end. Similarly, the channel end 206b1 corresponds to an end of the second channel region 202b on the image signal line 104 side, and is hereinafter referred to as a second channel end. Further, the pixel electrode 107 and the image signal line 104 are positioned outside the two channel regions formed in series, and hence the first channel end 206a1 and the second channel end 206b1 are hereinafter also referred to as an outer end of the first channel region 202a and an outer end of the second channel region 202b, respectively. Similarly, the channel end 206a2 and the channel end 206b2 are hereinafter also referred to as an inner end of the first channel region 202a and an inner end of the second channel region 202b, respectively.

A second impurity region 204a1 is positioned between the first channel region 202a and the first impurity region 203a while a second impurity region 204a2 is positioned between the first channel region 202a and the first impurity region 203b. Similarly, a second impurity region 204b1 is positioned between the second channel region 202b and the first impurity region 203c while a second impurity region 204b2 is positioned between the second channel region 202b and the first impurity region 203b. A boundary line between the second impurity region 204a1 and the first impurity region 203a and a boundary line between the second impurity region 204a2 and the first impurity region 203b are respectively denoted by 207a1 and 207a2. Similarly, a boundary line between the second impurity region 204b1 and the first impurity region 203c and a boundary line between the second impurity region 204b2 and the first impurity region 203b are respectively denoted by 207b1 and 207b2. Note that in FIG. 14, the second impurity regions 204 are formed in contact with all of the respective both ends of the two channel regions 202, but there may be a case where no second impurity region 204 is formed between the channel region 202 and the first impurity region 203.

Further, the first channel region 202a and the second channel region 202b illustrated in FIG. 14 have the same channel length. In other words, a distance between the first channel end 206a1 and the channel end 206a2 and a distance between the second channel end 206b1 and the channel end 206b2 are equal to each other. In addition, the second impurity regions 204 connected to the both ends of the channel regions 202 have the same region length. In other words, distances between the first channel end 206a1 and the boundary line 207a1, between the channel end 206a2 and the boundary line 207a2, between the second channel end 206b1 and the boundary line 207b1, and between the channel end 206b2 and the boundary line 207b2 are all equal to one another.

Next, the gate electrode film 102 is described. In FIG. 14, the gate electrode film 102 has the strip shape with a uniform strip width, and is opposed to the semiconductor film 201. The gate electrode film 102 includes a gate end 102a1 on the upper side of FIG. 14 and a gate end 102a2 on the lower side of FIG. 14. Regions of the gate electrode film 102 which are opposed to the semiconductor film 201 are referred to as gate regions. In other words, when the semiconductor film 201 is viewed from above, the gate regions correspond to regions of the gate electrode film 102 which are overlapped with the semiconductor film 201 positioned thereabove. Of the gate regions, regions spreading over the vicinities of the first channel region 202a and the second channel region 202b are respectively referred to as a first gate region and a second gate region. In other words, the first gate region corresponds to a region of the gate electrode film 102 which is overlapped with the first channel region 202a and the second impurity region 204a1 formed in contact therewith which are positioned above the gate electrode film 102. In FIG. 12 and FIG. 14 each illustrating a view from above, the first gate region is overlapped with the first channel region 202a and the second impurity region 204a1 formed in contact therewith which are formed above the gate electrode film 102, and hence is not illustrated. The same holds true for the second gate region. Note that an end of the first gate region on the pixel electrode 107 side and an end of the second gate region on the image signal line 104 side are hereinafter referred to as a first gate end and a second gate end, respectively. Both of the first gate end and the second gate end are positioned on the upper side of FIG. 14, and correspond to the gate end 102a1.

As described above, the semiconductor film 201 has the strip shape with the uniform strip width, and accordingly the first channel region 202a and the second channel region 202b are formed to have the same strip width. Therefore, areas of the regions in which the semiconductor film 201 and the gate electrode film 102 are opposed to each other are equal between the first channel region 202a and the vicinity thereof and the second channel region 202b and the vicinity thereof. In other words, the first gate region and the second gate region have the same area.

In the case of FIG. 14, the first channel end 206a1 and the second channel end 206b1 are both positioned inside with respect to the gate end 102a1, which corresponds to the first and second gate ends. Accordingly, the first channel region 202a and the second channel region 202b are sufficiently shielded against light by the gate electrode film 102 on the first channel end 206a1 side and the second channel end 206b1 side, respectively, that is, on outer sides of both the channel regions. In contrast, because the channel ends 206a2 and 206b2 are aligned with the gate end 102a2, the first channel region 202a and the second channel region 202b are merely shielded against light just by the gate electrode film 102 on the channel end 206a2 side and the channel end 206b2 side, respectively, that is, on inner sides of both the channel regions. As a result, the degree of light shielding is smaller in the vicinity of the inner end of each channel region as compared to the vicinity of the outer end thereof.

However, the vicinity of the outer channel end of each channel region, which is to be applied with a strong electric field, which may lead to a main cause of optical leakage current, is sufficiently shielded against light, and hence hole-electron pairs are less likely to be generated in the outer channel end, resulting in suppressed optical leakage current. Therefore, even when hole-electron pairs, which may generate optical leakage current, are generated in the vicinities of the inner channel ends of both the channel regions, optical leakage current is suppressed.

The capacitance of each channel region 202 and the vicinity thereof depends on each area of the region in which the semiconductor film 201 and the gate electrode film 102 are opposed to each other, that is, an area of each gate region.

If the capacitance is increased in each channel region 202 and in the vicinity thereof, when the gate voltage is turned off to maintain the pixel voltage, the increased parasitic capacitance causes the pixel voltage to be largely decreased, which results in a new cause of display failure, as described above.

In the structure illustrated in FIG. 14, there is produced an effect that, as compared to the case where the gate end 102a2 is positioned outside with respect to both of the inner ends 206a2 and 206b2 of the channel regions, increase in capacitance is suppressed while optical leakage current is suppressed to a comparative level or a level close to the above-mentioned case.

Similarly, in the structure illustrated in FIG. 14, there is also produced an effect that, as compared to the case where the gate end 102a1 is aligned with the first channel end 206a1 and the second channel end 206a2 being the outer ends of both the channel regions, the generated capacitance is increased, but generation of optical leakage current is suppressed.

Further, description is given by taking into consideration that hole-electron pairs are generated by light irradiation also in the second impurity region 204, though frequency of the generation is lower than that in the channel region 202.

In the case of FIG. 14, the boundary lines 207a1 and 207b1 are both aligned with the gate end 102a1, which corresponds to the first and second gate ends. Accordingly, the second impurity regions 204a1 and 204b2 are also shielded against light by the gate electrode film 102. In contrast, the second impurity regions 204a2 and 204b2 are positioned outside the gate electrode film 102, and accordingly are not shielded against light by the gate electrode film 102.

Taking the second impurity region 204 into consideration, hole-electron pairs causing optical leakage current are considered to be further generated in the vicinity of the inner channel end of each channel region. However, optical leakage current is suppressed in the vicinity of the outer channel end of each channel region, and hence the effect described above is more enhanced.

Embodiment 13

According to the present invention, it is not always necessarily to form the above-mentioned second impurity region 204. Accordingly, first, a structure without the above-mentioned second impurity region 204 is described below.

Figure 15C:
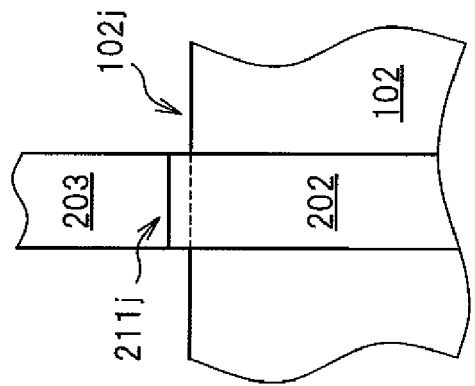
FIGS. 15A to 15C are enlarged plan views each illustrating a semiconductor film in which a first impurity region is formed in contact with a channel end of a channel region, and a gate electrode film positioned below the semiconductor film when viewed from above.
Figure 15B:
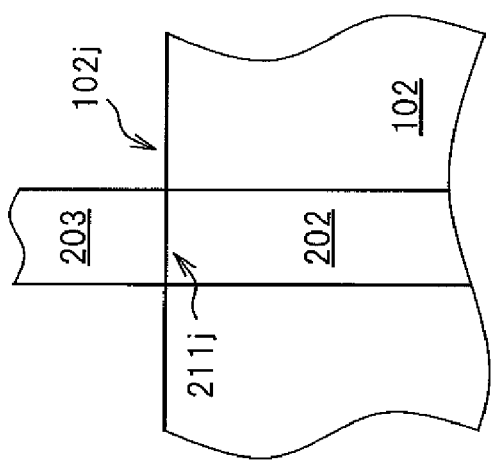
Figure 15A:
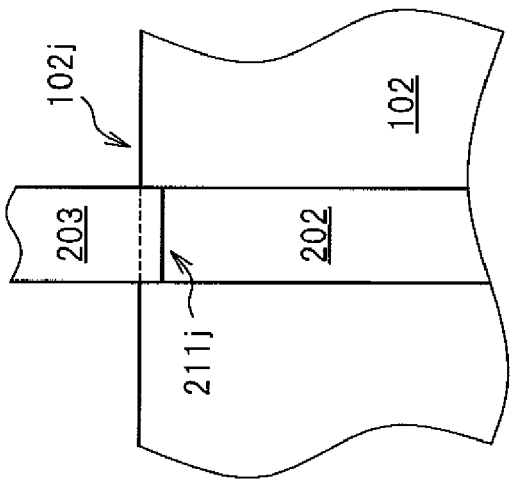

FIGS. 15A to 15C each illustrate a typical relative positional relation between a gate end 102j of the gate electrode film 102 formed below and opposed to the semiconductor film 201 and a channel end 211j of the channel region 202 of the semiconductor film 201, in one side of one TFT. The gate electrode film 102 is positioned below the semiconductor film 201, and the semiconductor film 201 and the gate electrode film 102 are opposed to each other in the vicinity of the channel region 202. FIGS. 15A to 15C each illustrate the semiconductor film 201 in which the first impurity region 203 is formed in contact with the channel end 211j of the channel region 202. As described above, the region of the gate electrode film 102 which is opposed to the semiconductor film 201 is referred to as the gate region.

In FIG. 15A, the channel end 211j is positioned inside with respect to the gate end 102j, and hence the channel region 202 on the channel end 211j side is sufficiently shielded against light by the gate electrode film 102.

Similarly, in FIG. 15B, because the channel end 211j is aligned with the gate end 102j, the channel region 202 on the channel end 211j side is shielded against light by the gate electrode film 102.

In FIG. 15C, the channel end 211j is positioned outside the gate end 102j, and hence the channel region 202 on the channel end 211j side is positioned outside the gate electrode film 102. Accordingly, the channel region 202 on the channel end 211j side is not sufficiently shielded against light by the gate electrode film 102.

The capacitance of each TFT largely depends on an area of the region in which the semiconductor film 201 and the gate electrode film 102 are opposed to each other in the TFT. When it is assumed that the channel regions of FIGS. 15A to 15C have the same shape and area, as the strip width of the gate electrode film 102 is larger, the area of the region in which the semiconductor film 201 and the gate electrode film 102 are opposed to each other becomes larger, to thereby increase the degree of light shielding, but at the same time, the capacitance is increased.

According to the present invention, the vicinities of the first channel end 206a1 and the second channel end 206b1, each of which may lead to a main cause of optical leakage current, have the structure of FIG. 15A. In other words, both of the vicinities of the first and second channel ends have the structure in which light is shielded by the gate electrode film 102, and accordingly have a function of suppressing optical leakage current.

Of the channel ends of the plurality of channel regions, channel ends other than the first and second channel ends also have any one of the structures of FIG. 15A, FIG. 15B, and FIG. 15C. According to the present invention, the vicinity of at least one channel end among the channel ends other than the first and second channel ends has a structure in which degree of light shielding is reduced whereas increase in capacitance is relatively suppressed, compared to the vicinities of the first and second channel ends. In this case, there is produced an effect that, as compared to the case where the vicinities of the channel ends other than the first and second channel ends have the same structure as the vicinities of the first and second channel ends, display failure due to increased capacitance is prevented while optical leakage current is suppressed to a comparable level or a level close to the above-mentioned case.

According to the present invention, the vicinities of the channel ends other than the first and second channel ends may also have any one of the structures of FIG. 15A, FIG. 15B, and FIG. 15C. In the case of the structure of FIG. 15A, because the degree of light shielding is reduced, respective distances between the channel end 211j and the gate end 102j in the vicinities of the channel ends other than the first and second channel ends are smaller than respective distances between the channel end 211j and the gate end 102j in the vicinities of the first and second channel ends. Further, in the cases of the structures of FIG. 15B and FIG. 15C, the degree of light shielding is reduced but increase in capacitance is relatively suppressed in both of the structures. Accordingly, in the case of the structure of FIG. 15C, the respective distances between the channel end 211j and the gate end 102j in the vicinities of the channel ends other than the first and second channel ends may not necessarily be smaller than the respective distances, but may be larger than any one of the distances between the channel end 211j and the gate end 102j in the vicinities of the first and second channel ends, and the present invention is applicable to both cases.

Embodiment 14

Next, a structure in which the above-mentioned second impurity region 204 is formed in contact with the channel region 202 is described.

FIGS. 16A to 16E each illustrate a typical relative positional relation among the gate end 102j of the gate electrode film 102 positioned below and opposed to the semiconductor film 201, the channel end 212j of the channel region 202 of the semiconductor film 201, and the second impurity region 204, in one side of one TFT.

Also in this case, the same description as in Embodiment 13 may be given in view of the fact that hole-electron pairs are more likely to be generated by light irradiation in the channel region 202 than in the second impurity region 204.

Further, the same description as in Embodiment 13 may be given also in view of the fact that hole-electron pairs are more likely to be generated by light irradiation in the second impurity region 204 than in the first impurity region 203, in which a relative positional relation between a boundary line 213$j$ and the gate end 102$j$ may be described instead of the relative positional relation between the channel end 211$j$ and the gate end 102$j$ in each of FIGS. 15A to 15C of Embodiment 13.

Embodiment 15

Further, respectively in Embodiment 13 and Embodiment 14, the description has been given of the cases where no second impurity region 204 is formed in contact with the relevant channel end and where the second impurity region 204 is formed in contact therewith. However, there may be a case where the second impurity region 204 is formed in contact with one of the channel ends of the channel region while no second impurity region 204 is formed in contact with another channel end thereof.

Figure 17A:
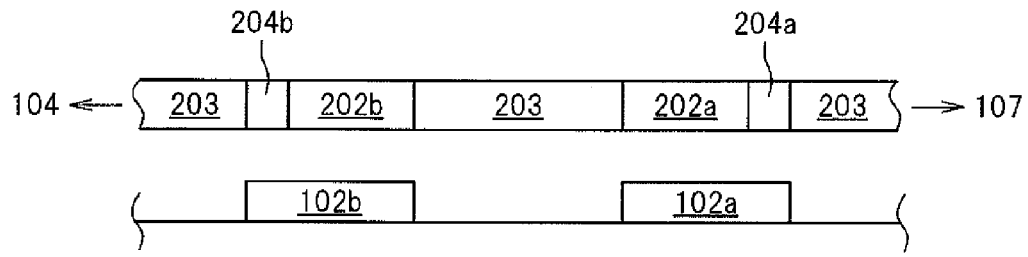
FIGS. 17A to 17C are schematic views each illustrating a structure of two TFTs having a multi-gate structure.

An embodiment of this case is illustrated in a schematic view of FIG. 17A. FIG. 17A illustrates a multi-gate structure in which two TFTs are connected in series via the first impurity region 203. The first channel region 202$a$ and the second channel region 202$b$ are connected to the pixel electrode 107 and the image signal line 104, respectively, via the first impurity region 203.

The channel end of the first channel region 202$a$ on the pixel electrode 107 side, that is, the first channel end 206$a$1 being the outer channel end is positioned inside with respect to the gate end of the opposed gate electrode film 102$a$. The channel end of the second channel region 202$b$ on the image signal line 104 side, that is, the second channel end 206$b$1 being the outer channel end is positioned inside with respect to the gate end of the opposed gate electrode film 102$b$. Accordingly, each of the channel regions 202 is shielded against light by the gate electrode film 102 on the outer side of the channel region, resulting in a structure for suppressing optical leakage current. Further, in FIG. 17A, the second impurity regions 204$a$ and 204$b$ are formed in contact with the first and second channel ends, respectively, and the second impurity regions 204 are both shielded against light by the gate electrode films 102, resulting in a structure for further suppressing optical leakage current. Note that in FIG. 17A, the first channel end 206$a$1 is a boundary line between the first channel region 202$a$ and the second impurity region 204$a$ while the second channel end 206$b$1 is a boundary line between the second channel region 202$b$ and the second impurity region 204$b$.

In contrast, the inner channel ends of the first and second channel regions are aligned with the gate ends of the opposed gate electrode films 102$a$ and 102$b$, respectively, and each of the inner channel ends is positioned at a smaller distance from the corresponding gate end than respective distances between the first and second channel ends and the corresponding nearest gate ends. In addition, no second impurity region 204 is formed in contact with each inner channel end.

With this structure, each of the channel region 202 and the vicinity thereof have a smaller degree of light shielding on the inner side than the outer side thereof, and have a structure for giving a higher priority to suppressing increase in capacitance than to suppressing optical leakage current. Therefore, there is produced an effect that, as compared to the case where the vicinity of the inner channel end of the channel region 202 has the same structure as the vicinities of the first and second channel ends, display failure due to increased capacitance is prevented while optical leakage current is suppressed to a comparable level or a level close to the above-mentioned case.

Embodiment 16

In Embodiment 16, description is given as being limited to the case where the second impurity regions 204 are respectively formed in contact with the first and second channel ends.

As described above, in the vicinity of the first channel end 206$a$1 when the pixel electrode 107 is maintained at a higher potential, and in the vicinity of the second channel end 206$b$1 when the image signal line 104 is maintained at a higher potential, a stronger electric field is often generated than in the vicinities of other channel ends, and as a result, the vicinity of the relevant channel end may cause increased optical leakage current. In view of the above, when the second impurity region 204 is formed in contact with the relevant channel end, in the vicinity of the channel end, a potential gradient is caused, that is, the electric field is reduced with the aid of the second impurity region 204, resulting in further suppressed optical leakage current.

In this case, in each of the vicinities of the first and second channel ends, the channel end is positioned inside with respect to the gate end, and the second impurity region 204 is formed in contact with the channel end. Accordingly, one of the structures of FIG. 16A, FIG. 16B, and FIG. 16C is employed. An embodiment of this case directly applies to the example illustrated in the schematic view of FIG. 17A.

Embodiment 17

With regard to at least one channel end of channel ends other than the first and second channel ends, the gate end is positioned closer to the relevant channel end. It is assumed that the second impurity region 204 is formed in contact with the relevant gate end. In this case, the relevant gate end may have any one of the structures of FIGS. 16A to 16E depending on the structure of the vicinity of the first or second channel end.

In this embodiment, description is given as being limited to the case where the gate end 102$j$ is positioned inside with respect to the boundary line 213$j$ which is the end of the second impurity region 204 on the first impurity region 203 side. In other words, the description is given as being limited to the cases of the structures of FIG. 16C, FIG. 16D, and FIG. 16E.

In this embodiment, because the gate end 102$j$ is positioned inside with respect to the boundary line 213$j$, at least a part of the second impurity region 204 is not shielded against light by the gate electrode film 102. In other words, taking the second impurity region 204 into consideration, the degree of light shielding is reduced compared to the vicinities of the first and second channel ends, and therefore the structure is not capable of suppressing optical leakage current but giving a higher priority to prevention of display failure due to increased capacitance. As a whole, however, there is produced an effect that, as compared to the case where the vicinity of the relevant channel end has the same structure as the structure of the first or second channel end, display failure due to increased capacitance is prevented while optical leakage current is suppressed to a comparable level or a level close to the above-mentioned case.

Embodiment 18

Description is given as being further limited to the case where the second impurity regions 204 are formed in contact also with all of the channel ends other than the first and second channel ends in Embodiment 16. In this case, with the aid of the second impurity regions 204, a potential gradient is caused, that is, an electric field is reduced also in all the vicinities of the channel ends other than the first and second channel ends, resulting in further suppressed leakage current.

Figure 17B:
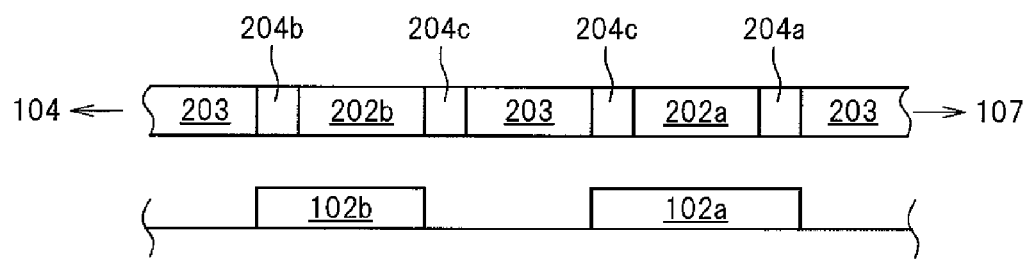

An example of this embodiment is illustrated in a schematic view of FIG. 17B. As in FIG. 17A, FIG. 17B illustrates a multi-gate structure in which two TFTs are connected in series via the first impurity region 203. The first channel region 202a and the second channel region 202b are connected to the pixel electrode 107 and the image signal line 104, respectively, via the first impurity region 203.

Further, as in FIG. 17A, the first channel end 206a1 positioned on the right end of FIG. 17B and the second channel end 206b1 positioned on the left end of FIG. 17B are positioned inside with respect to the gate ends of the gate electrode films 102a and 102b, respectively, which are opposed to the first and second channel ends 206a1 and 206b1, and at the same time, the second impurity regions 204a and 204b respectively formed in contact with the first and second channel ends 206a1 and 206b1 are respectively shielded against light by the gate electrode films 102a and 102b, resulting in a structure for suppressing optical leakage current.

In contrast, in the vicinity of another channel end of the second impurity region 202b, that is, the vicinity of the channel end on the right side of FIG. 17B, the gate end of the gate electrode film 102b on the right side of FIG. 17B is positioned inside with respect to the right end of the second impurity region 204c of FIG. 17B formed in contact with the right side of the second channel region 202b of FIG. 17B. As a result, the vicinity of the relevant channel end has a structure for giving a higher priority to prevention of display failure due to increased capacitance than to suppression of leakage current.

Another example of this embodiment is illustrated in a schematic view of FIG. 17D. FIG. 17D illustrates a multi-gate structure in which four TFTs are connected in series. As in FIG. 17A and FIG. 17B, the first channel region 202a and the second channel region 202b are connected to the pixel electrode 107 and the image signal line 104, respectively, via the first impurity region 203.

In FIG. 17D, each of the vicinities of the first and second channel ends has a larger degree of light shielding by the gate electrode film 102, and has a structure for suppressing optical leakage current. A part of channel ends other than the first and second channel ends has a structure for giving a higher priority to prevention of display failure due to increased capacitance than to suppression of leakage current. Specifically, the part corresponds to the vicinity of the channel end of the second channel region 202b on the right side of FIG. 17D which is positioned to the leftmost of FIG. 17D, the vicinity of both channel ends of the channel region 202c positioned at the second from the left of FIG. 17D, and the vicinity of the channel end of the channel region 202c on the right side of FIG. 17D which is positioned at the second from the right of FIG. 17D.

As a result, in addition to the effect of suppressing leakage current with the aid of the second impurity region 204, there is produced an effect that, as compared to the case where the vicinities of the channel ends other than the first and second channel ends have the same structure as the vicinities of the first and second channel ends, display failure due to increased capacitance is prevented while optical leakage current is suppressed to a comparable level or a level close to the above-mentioned case.

Embodiment 19

Description is given as being further limited to the case where, with regard to all of the channel ends other than the first and second channel ends, the gate end 102j is positioned inside with respect to the boundary line 213j which is the end of the second impurity region 204 on the first impurity region 203 side in Embodiment 18. In other words, the description is given as being limited to the cases of the structures of FIG. 16C, FIG. 16D, and FIG. 16E.

In this case, each of the vicinities of the first and second channel ends has a structure for giving a higher priority to suppression of optical leakage current while each of the vicinities of all of the channel ends other than the first and second channel ends has a structure for giving a higher priority to prevention of display failure due to increased capacitance than to suppression of optical leakage current.

An example of this embodiment applies to the example illustrated in FIG. 12 and FIG. 14 that have been described above. In this example, as described above, the second impurity regions 204 are respectively formed in contact with the both sides of the channel regions. Further, each of the channel regions has a structure for suppressing optical leakage current on the outer side thereof while having a structure for preventing display failure due to increased capacitance on the inner side thereof.

Figure 17C:
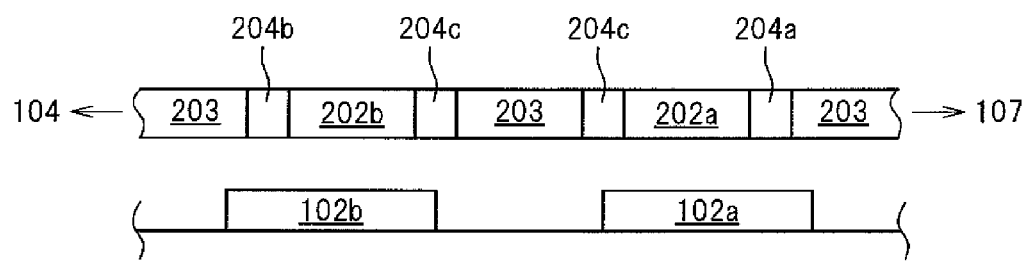

Another example of two TFTs having the multi-gate structure according to this embodiment is illustrated in a schematic view of FIG. 17C. In FIG. 17C, the gate ends of the opposed gate electrode films 102a and 102b are respectively positioned outside with respect to the second impurity regions 204a and 204b formed in contact with the outer channel ends of both the channel regions 202. Accordingly, as compared to the case of FIG. 12 and FIG. 14, each of the channel regions 202 has a much larger degree of light shielding on the outer side thereof, resulting in a structure for further suppressing optical leakage current. In contrast, the gate ends are respectively positioned outside with respect to the inner channel ends of both the channel regions and inside with respect to the second impurity regions 204c formed in contact with the inner channel ends. Accordingly, each of the channel regions has a structure for more preventing display failure due to increased capacitance on the inner side thereof than on the outer side thereof. Besides, each of the channel regions has a larger degree of light shielding also on the inner side thereof compared to the case of FIG. 12 and FIG. 14.

As a result, in the example illustrated in FIG. 17C, there is employed a structure for giving a higher priority to suppression of optical leakage current as a whole, compared to the example illustrated in FIG. 12 and FIG. 14. However, as in the example illustrated in FIG. 12 and FIG. 14, there is produced an effect that, as compared to the case where the vicinities of the inner channel ends of both the channel regions have the same structure as the vicinities of the outer channel ends thereof, display failure due to increased capacitance is prevented while optical leakage current is suppressed to a comparable level or a level close to the above-mentioned case.

Figure 17E:
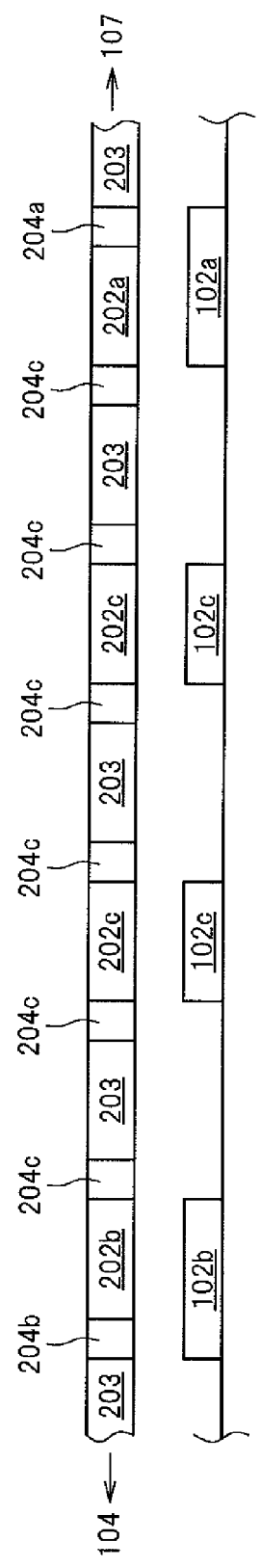

Further, an example of four TFTs having a multi-gate structure according to this embodiment is illustrated in a schematic view of FIG. 17E. In FIG. 17E, among the second impurity regions 204 which are formed in contact with both ends of the four channel regions 202 formed in series, the second impurity regions 204a and 204b respectively formed in contact with the first and second channel ends are respectively shielded against light by the gate electrode films 102a and 102b, resulting in a structure for suppressing optical leakage current. In contrast, the second impurity regions 204c formed in contact with all of the channel ends other than the first and second channel ends are not shielded against light by the gate electrode films 102, resulting in a structure for preventing display failure due to increased capacitance.

With those structures, in addition to the effect of suppressing leakage current with the aid of the second impurity region 204, there is produced a remarkable effect that, as compared to the case where the vicinities of all of the channel ends have the same structure as the vicinities of the first and second channel ends, display failure due to increased capacitance is prevented while optical leakage current is suppressed to a comparable level or a level close to the above-mentioned case.

Embodiment 20

The present invention employs the structure in which an area of the region in which the semiconductor film 201 and the gate electrode film 102 are opposed to each other varies among the plurality of TFTs. As described with reference to FIG. 12 and FIG. 14, the gate electrode film 102 has the strip shape. When the strip width thereof is selectively varied among the plurality of TFTs, the area of the region in which the semiconductor film 201 and the gate electrode film 102 are opposed to each other is varied.

Figure 18:
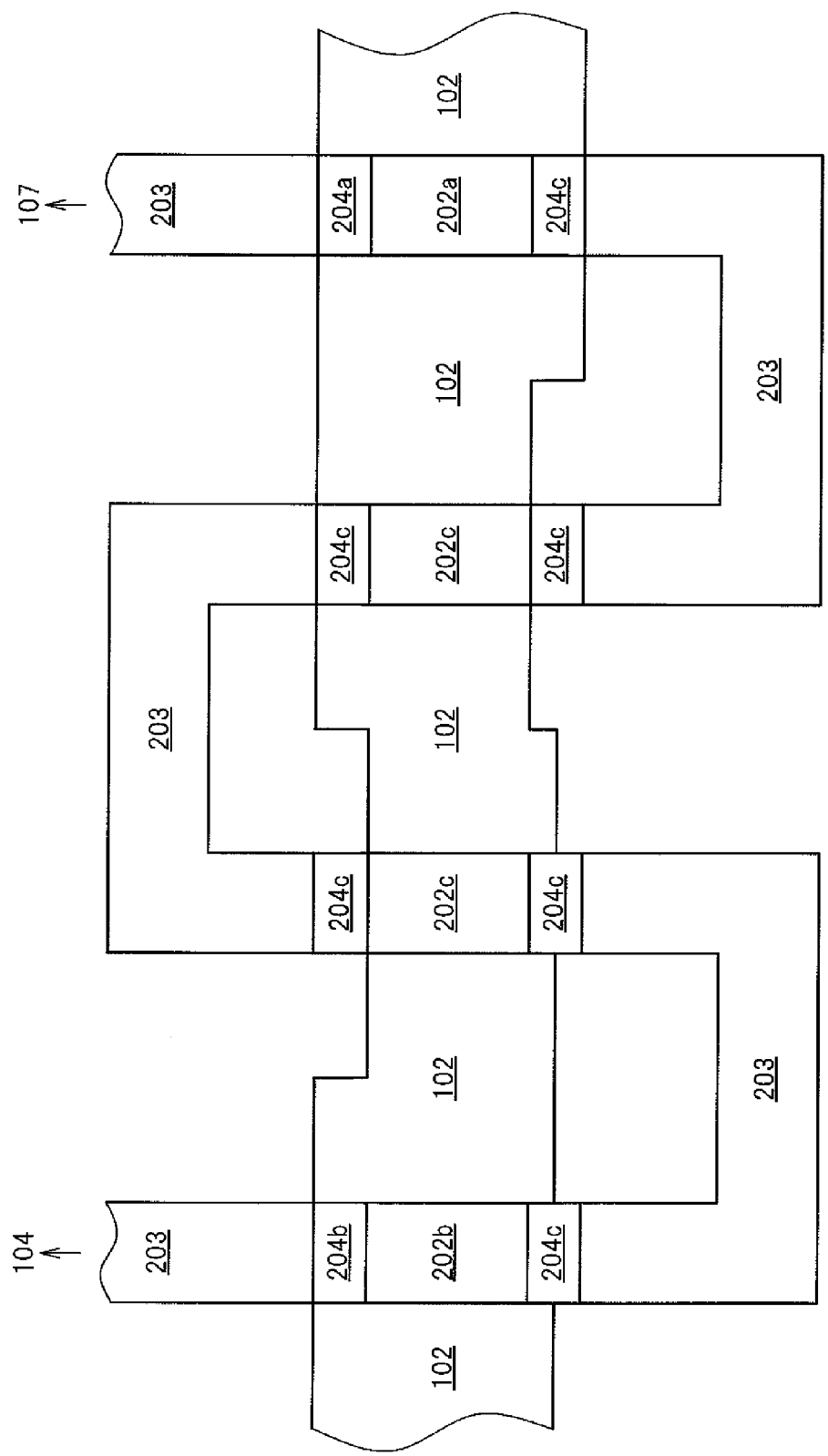
FIG. 18 is an enlarged plan view of the TFTs having the structure of FIG. 17D when viewed from above.

An embodiment of the shape of the gate electrode film 102 in this case is illustrated in FIG. 18. FIG. 18 is an enlarged plan view of the four TFTs having the multi-gate structure illustrated in FIG. 17D when viewed from above.

The gate electrode film 102 has the strip shape in which the strip width thereof varies among the TFTs. The gate insulation film 303 is laminated on top of the gate electrode film 102 having the above-mentioned shape, and a predetermined semiconductor film 201 is formed thereon. In FIG. 18, the TFTs have the same strip width and channel length of the channel region 202 and the same region length of the second impurity region 204. In other words, the TFTs have the same shape and area of the channel region 202 and the same shape and area of the second impurity region 204 formed in contact with the channel region 202. In this case, the TFTs have the same shape of the semiconductor film 201, but may be different in structure because of the shape of the gate electrode film 102 having the varying strip width.

Note that the channel region 202, the second impurity region 204, the first impurity region 203 have been described above, but the boundary positions thereamong may be difficult to define strictly. The reason therefor is as follows. When impurities are actually implanted, impurity concentration continuously varies in the boundary between the regions, and accordingly in a strict sense, the boundary between the regions has a certain finite width, not a line. Therefore, the boundary positions are defined as region outer periphery positions of the photoresist 311 to be applied in a manufacturing stage, as illustrated in, for example, FIG. 6F and FIG. 6G.

Note that the case of the N-type TFT whose carriers are determined as electrons by its impurities has been described above by way of example. However, the present invention is applicable to a case of a P-type TFT whose carriers are holes.

Figure 19:
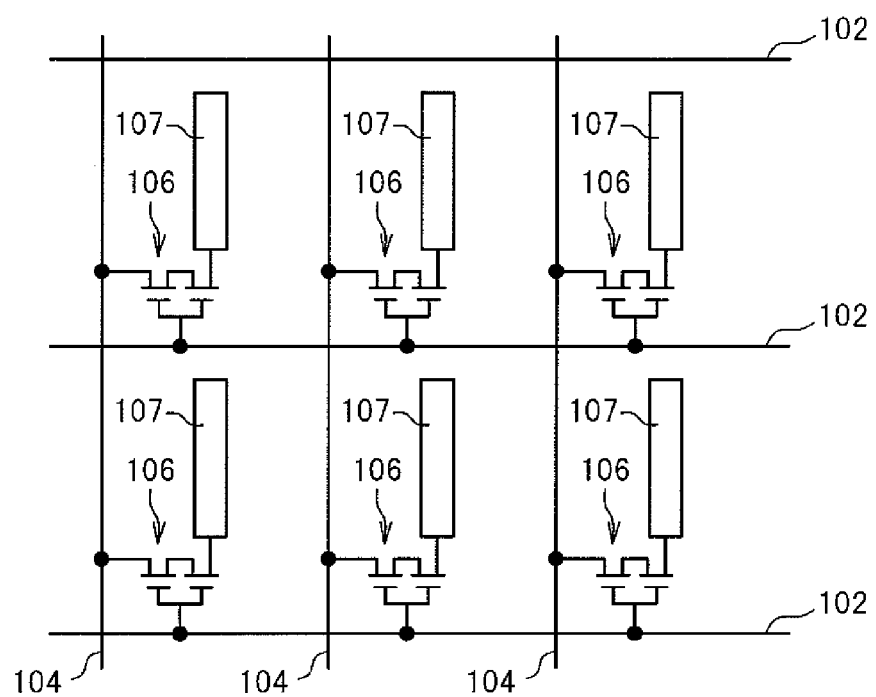
FIG. 19 is an example of an equivalent circuit diagram of a TFT substrate constituting a vertically aligned (VA) or twisted nematic (TN) mode liquid crystal display device.

Note that in the display device according to each of the embodiments of the present invention, the IPS mode liquid crystal display device has been described above by way of example. However, the present invention is also applicable to liquid crystal display devices employing such other driving modes as other modes of the IPS mode, a vertically aligned (VA) mode, and a twisted nematic (TN) mode, and to other types of display device. FIG. 19 is a diagram illustrating an equivalent circuit of a TFT substrate 2 constituting the VA or TN mode liquid crystal display device. In the case of the VA or TN mode liquid crystal display device, the common electrodes 108 (not shown) are formed in the filter substrate 1 opposed to the TFT substrate 2.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
    a semiconductor film comprising a plurality of channel regions formed in series between an image signal line and a pixel electrode with impurity doped regions in which predetermined impurities are doped being interposed between any two adjacent channel regions among the plurality of channel regions, the plurality of channel regions comprising at least a first channel region and a second channel region;
    a light source which generates light, the light source being disposed on one side of the semiconductor film; and
    a gate electrode film formed between the semiconductor film and the light source, the gate electrode film comprising:
        a first gate region spreading over a region opposed to the first channel region of the semiconductor film on a side of the light source; and
        a second gate region spreading over a region opposed to the second channel region of the semiconductor film on the side of the light source,
    wherein a relative area of the first gate region with respect to the first channel region is different from a relative area of the second gate region with respect to the second channel region.

2. A display device according to claim 1, wherein the impurity doped regions comprise a low concentration region formed in at least one region adjacent to one of the first channel region and the second channel region, the low concentration region being doped with one of the predetermined impurities and impurities different from the predetermined impurities at concentration lower than impurity concentration of a region formed outside the low concentration region.

3. A display device according to claim 1, wherein the gate electrode film has a strip shape with a varying strip width.

4. A display device according to claim 1, wherein a width of one of the first gate region and the second gate region is larger than a width of the first channel region and the second channel region, and a width of an other of the first gate region and the second gate region is substantially same as the width of the first channel region and the second channel region.

5. A display device according to claim 2, wherein an area of the first gate region is larger than an area of the first channel region.

6. A display device according to claim 5, wherein one of an area of the second channel region and an area determined by adding together the area of the second channel region and an area of the low concentration region formed adjacent to the second channel region in a case where the low concentration region is formed adjacent to the second channel region is larger than an area of the second gate region.

7. A display device according to claim 6, wherein the impurity doped regions further comprise the low concentration regions formed in regions adjacent to both ends of the first channel region and both ends of the second channel region.

8. A display device according to claim 7, wherein the first channel region is positioned closest to the pixel electrode among the plurality of channel regions.

9. A display device according to claim 8, wherein one of an area of each of the plurality of channel regions excluding the first channel region and an area determined by adding together the area of the each of the plurality of channel regions and an area of the low concentration region formed adjacent to the each of the plurality of channel regions in a case where the low concentration region is formed adjacent to the each of the plurality of channel regions is larger than an area of a region of the gate electrode film, the region of the gate electrode film being opposed to the each of the plurality of channel regions.

* * * * *